(12) United States Patent
Kawamura et al.

(10) Patent No.: US 8,816,339 B2
(45) Date of Patent: Aug. 26, 2014

(54) ORGANIC EL DISPLAY PANEL, AND METHOD FOR PRODUCING SAME

(71) Applicant: Panasonic Corporation, Osaka (JP)

(72) Inventors: Hiroshi Kawamura, Osaka (JP); Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/709,445

(22) Filed: Dec. 10, 2012

(65) Prior Publication Data

US 2013/0099221 A1    Apr. 25, 2013

Related U.S. Application Data

(63) Continuation of application No. PCT/JP2010/004988, filed on Aug. 6, 2010.

(51) Int. Cl.
*H01L 51/52* (2006.01)
*H01L 51/50* (2006.01)
*H01L 51/00* (2006.01)
*H01L 27/32* (2006.01)
*H01L 51/56* (2006.01)

(52) U.S. Cl.
CPC ............ *H01L 51/5092* (2013.01); *H01L 51/52* (2013.01); *H01L 27/3211* (2013.01); *H01L 27/3246* (2013.01); *H01L 27/3258* (2013.01); *H01L 51/56* (2013.01); *H01L 51/0001* (2013.01)
USPC ......... 257/40; 257/E33.065; 313/505; 438/34

(58) Field of Classification Search
CPC ............................ H01L 51/5096; H01L 51/52
USPC .......... 257/40, E33.065; 313/505; 438/34, 35
See application file for complete search history.

(56) References Cited

U.S. PATENT DOCUMENTS

| | | | |
|---|---|---|---|
| 5,443,922 A | | 8/1995 | Nishizaki et al. |
| 7,365,367 B2 * | | 4/2008 | Han et al. ........................ 257/88 |
| 7,893,607 B2 * | | 2/2011 | Terakado et al. ............. 313/503 |
| 2003/0080338 A1 * | | 5/2003 | Yamazaki et al. .............. 257/59 |
| 2004/0119066 A1 * | | 6/2004 | Han et al. ........................ 257/40 |
| 2010/0213827 A1 | | 8/2010 | Yoshida et al. |
| 2013/0240863 A1 * | | 9/2013 | Sato et al. ....................... 257/40 |

FOREIGN PATENT DOCUMENTS

| | | |
|---|---|---|
| JP | 05-163488 | 6/1993 |
| JP | 2004-111166 | 4/2004 |
| JP | 2006-032198 | 2/2006 |

(Continued)

*Primary Examiner* — Allan R Wilson
(74) *Attorney, Agent, or Firm* — Greenblum & Bernstein, P.L.C.

(57) ABSTRACT

An organic EL display panel includes a substrate; an interlayer insulating layer on the substrate; first electrodes on the interlayer insulating layer to correspond to element formation regions in rows and columns; banks extending in columns to partition the regions in rows; organic light-emitting layers above the first electrodes, and each containing organic light-emitting material having light-emitting color differing between each two adjacent regions in rows; and second electrodes above the light-emitting layers, and being opposite in polarity to the first electrodes, wherein the interlayer insulating layer has first opening corresponding to interval between each two adjacent first electrodes in rows, the banks each have integrally formed buried part and main part, the buried part fills the interval and the first opening, and the main part is protrusion of the buried part and has recess on top thereof along with shapes of the interval and the first opening.

13 Claims, 21 Drawing Sheets

(56) References Cited

FOREIGN PATENT DOCUMENTS

| | | |
|---|---|---|
| JP | 2006-058751 | 3/2006 |
| JP | 2007-095520 | 4/2007 |
| JP | 2009-272276 | 11/2009 |
| JP | 2010-073700 | 4/2010 |
| JP | 2010-165612 | 7/2010 |

* cited by examiner

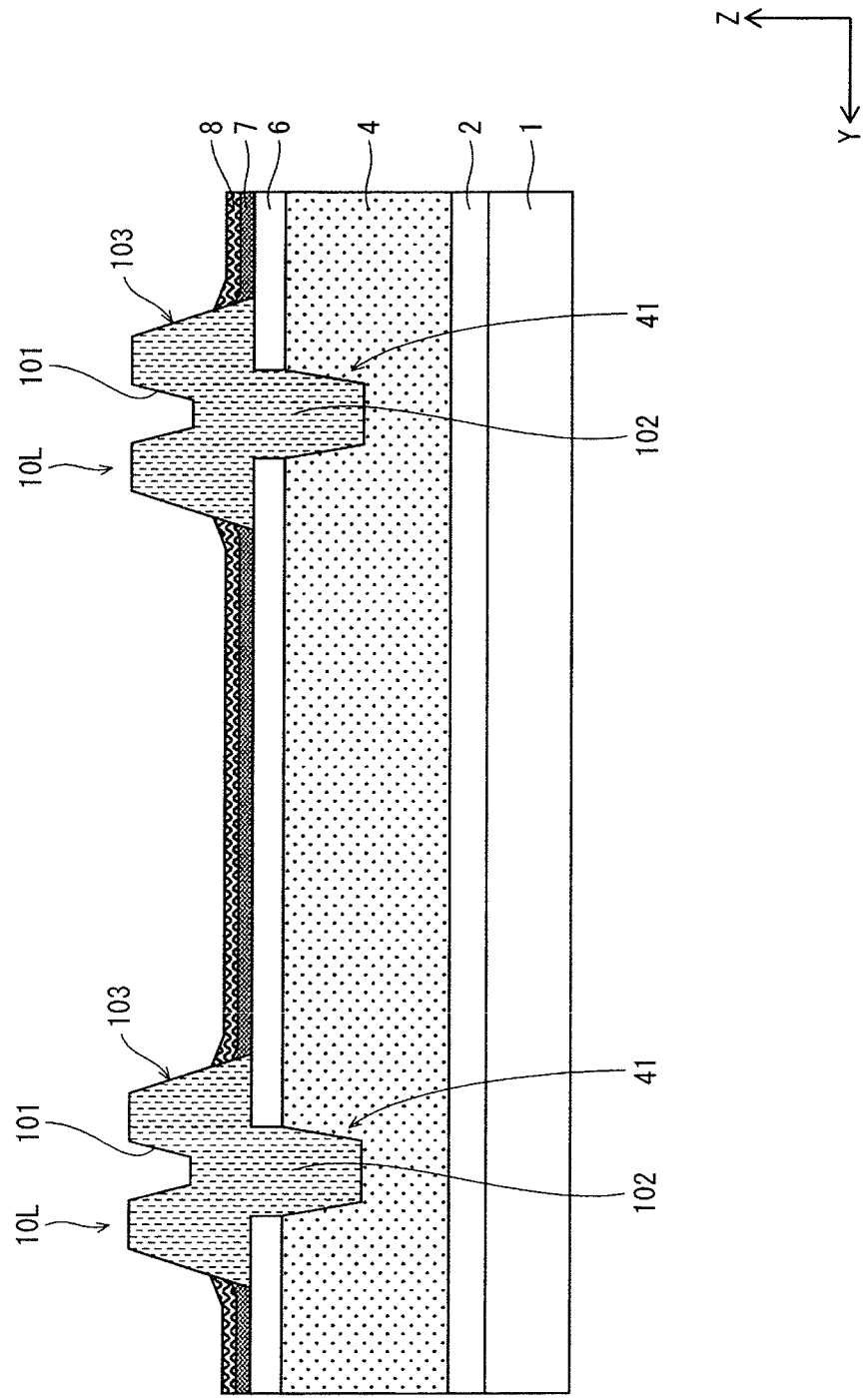

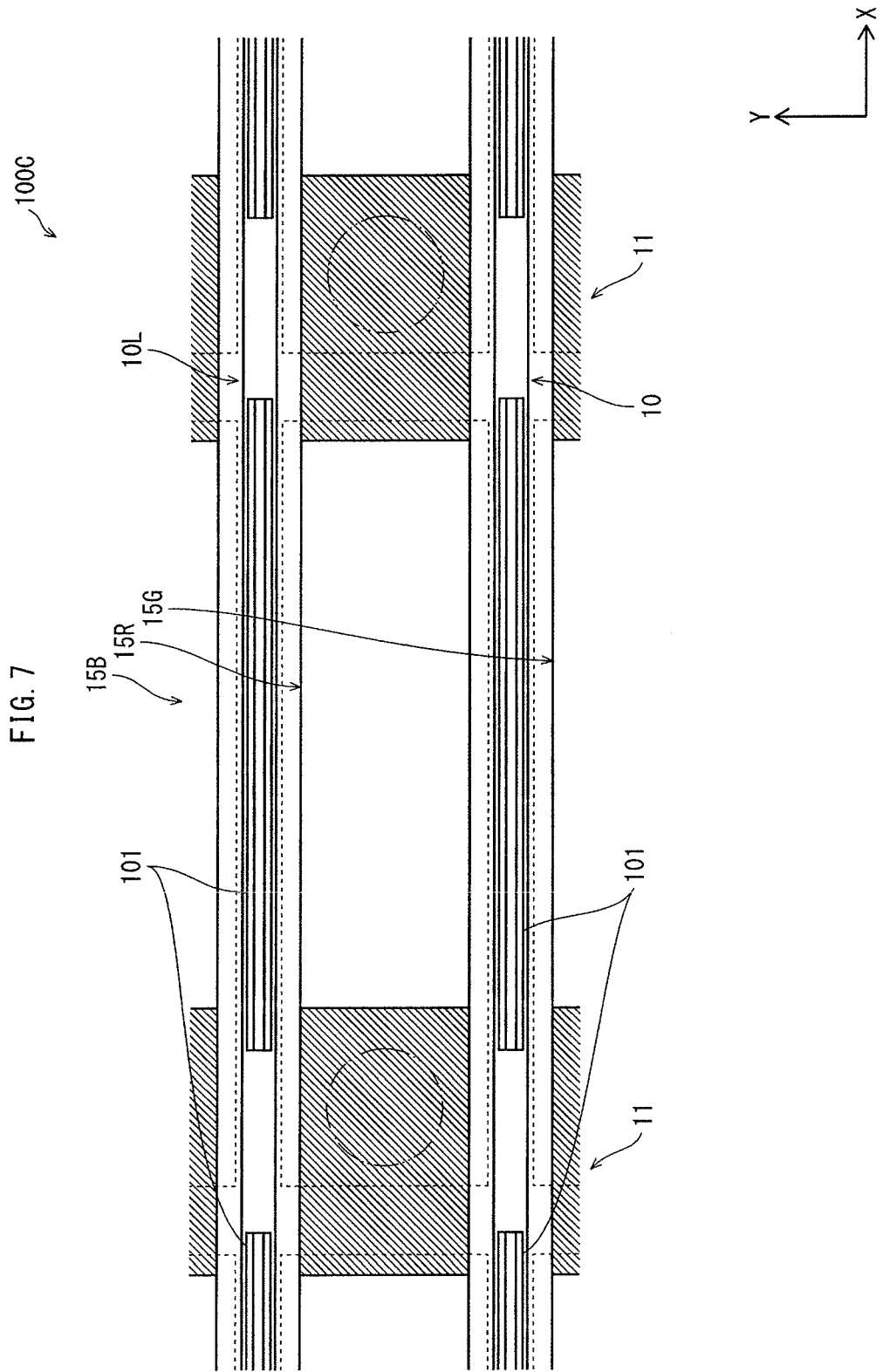

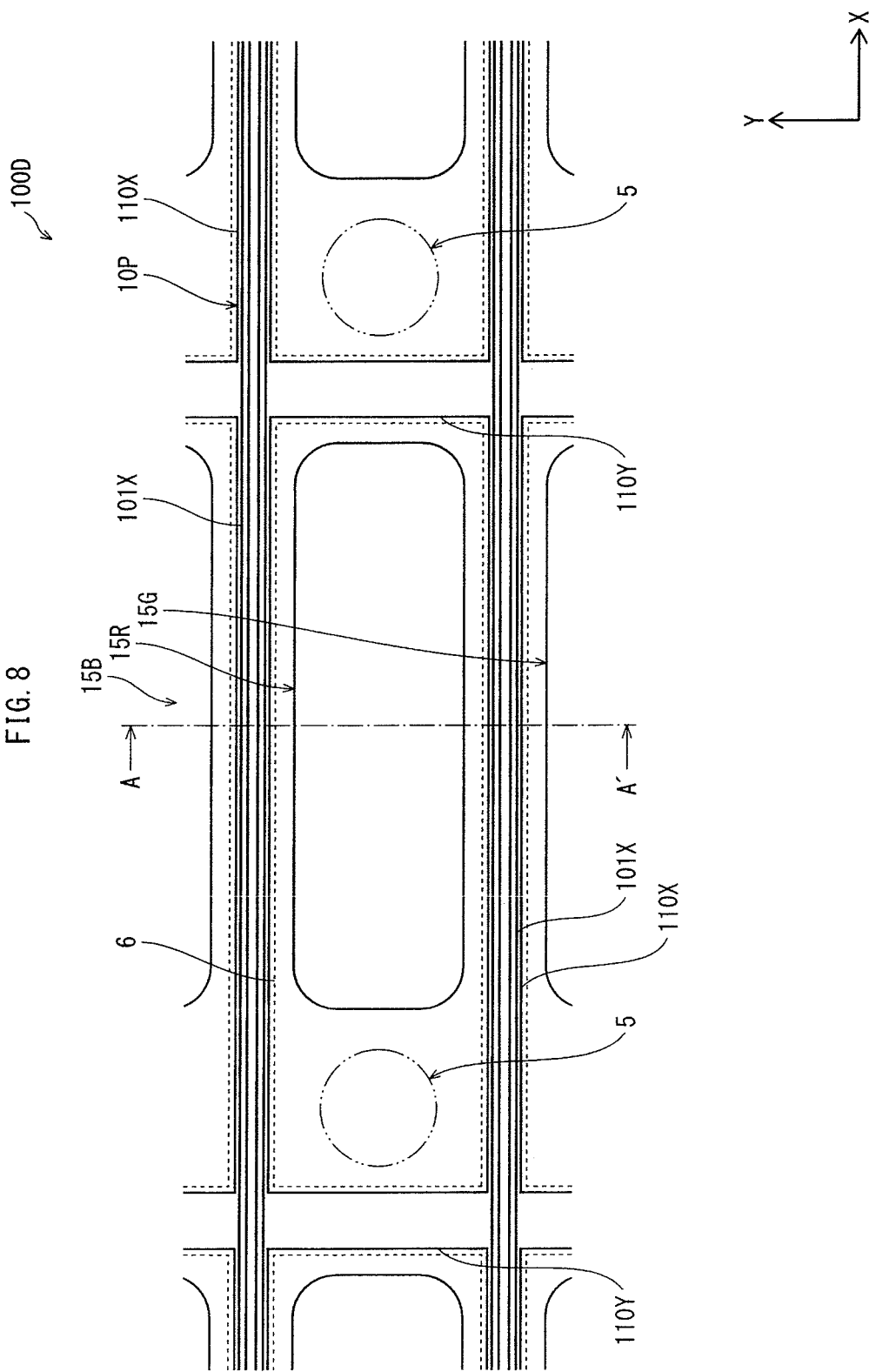

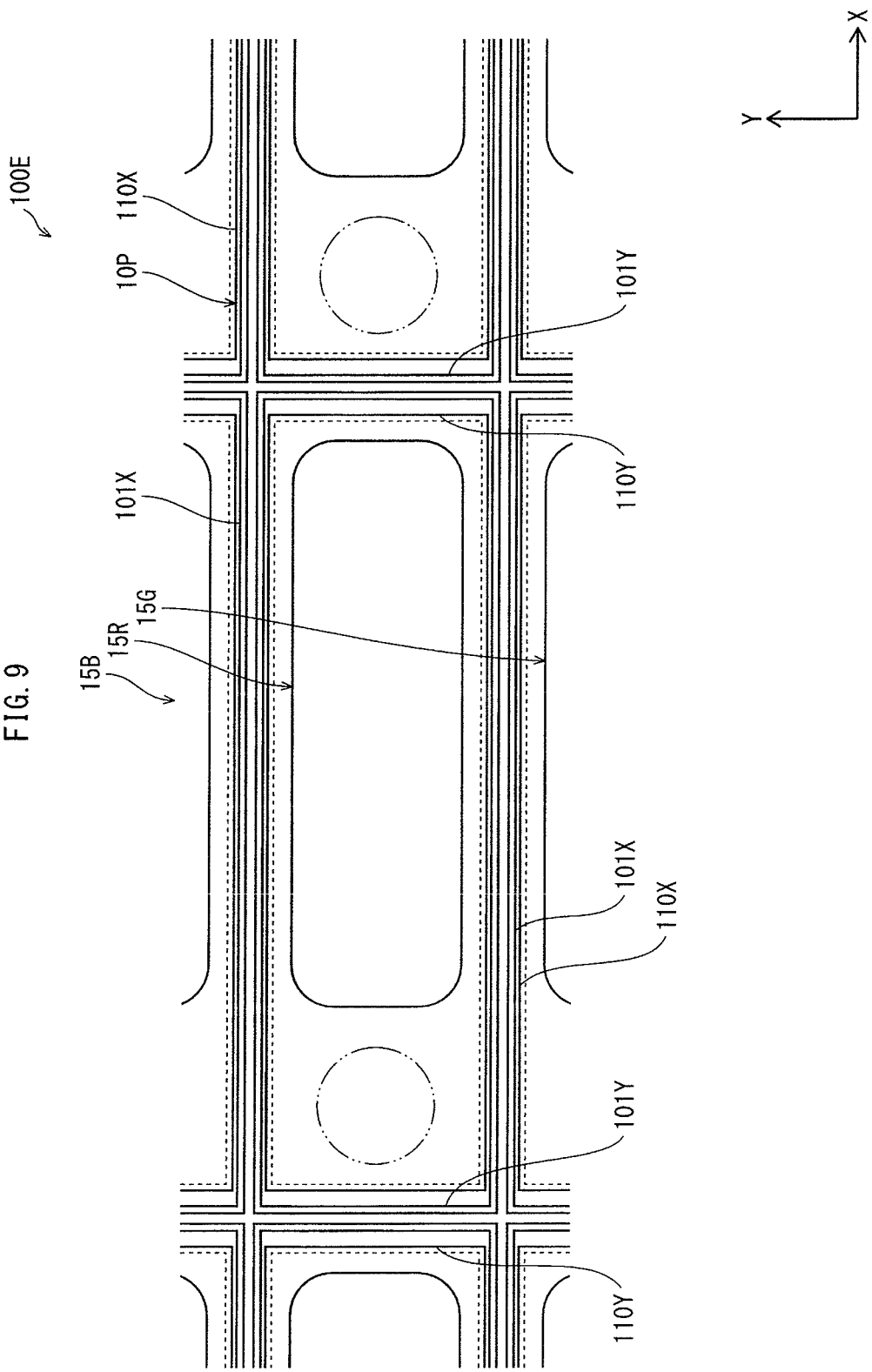

ORGANIC EL DISPLAY PANEL, AND METHOD FOR PRODUCING SAME

CROSS REFERENCE TO RELATED APPLICATION

This is a continuation application of PCT Application No. PCT/JP2010/004988 filed Aug. 6, 2010, designating the United States of America, the disclosure of which, including the specification, drawings and claims, is incorporated herein by reference in its entirety.

TECHNICAL FIELD

The present disclosure relates to an organic EL display panel with use of organic electroluminescence elements (hereinafter, referred to as "organic EL elements") and a method of manufacturing the organic EL display panel, and particularly relates to an art of preventing color mixture of inks in an application step of forming an organic light-emitting layer and so on.

DESCRIPTION OF THE RELATED ART

An organic EL element is a current-driven light-emitting element, and has the basic structure in which an organic light-emitting layer containing an organic material is provided between an anode and a cathode. Upon application of voltage between the anode and the cathode when driven, holes injected from the anode to the functional layers recombine with electrons injected from the cathode to the functional layers. The recombination causes phenomenon of electroluminescence. Being self-luminescent, the organic EL element is highly visible. In addition, being completely solid, the organic EL element has excellent impact resistance properties.

One of the types of organic EL elements is an applying-type. Specifically, an ink containing a high-molecular material, a low molecular appropriate for thin film formation, and so on is regulated, the regulated ink is applied to a substrate by a inkjet method or the like to form an organic light-emitting layer, a charge injection layer, and so on. Recently, an organic EL display panel that is composed of a plurality of applying-type organic EL elements arranged above a substrate rows and columns on which a TFT wiring part is formed has been put in practical use as various types of displays, image display devices, and the like.

Organic EL elements arranged on an organic EL display panel are partitioned into separate organic EL elements or each certain number of organic EL elements for each color by a bank (barrier) having a predetermined shape. One typical example of an organic EL panel having the line structure in which banks each extending in the column direction (perpendicular direction) are arranged above the substrate in parallel in the row direction (horizontal direction). Each two adjacent banks has therebetween the predetermined number of organic EL elements of the same color at regular intervals. An organic EL element of any one of light-emitting colors of RGB are arranged in the column direction. This realizes color display by the entire organic EL display panel. Note that alternatively, the banks may be so-called pixel banks each for partitioning and defining for each organic EL element.

In an application step by a typical inkjet method, an application target substrate is placed on a stage, and an inkjet head is moved to scan over the substrate in the row direction or the column direction. On organic EL element formation regions (hereinafter, referred to as "element formation regions") above the substrate, a nozzle ejects droplets of a solution (hereinafter, referred to as "ink") containing an organic material of an organic light-emitting layer, a charge injection layer, and so on and a solvent (see Patent Literature 1). Note that the inkjet head is driven by a drive system such as a piezo system.

In the ink application step, there is a possibility that while the application target substrate to which the ink has been applied is moved or conveyed, the applied ink overflows beyond the banks due to vibration or acceleration resulting from conveying the application target substrate. If the ink overflows, the overflowed ink enters an element formation region of a different light-emitting color to cause color mixture of inks that is contamination. This makes it difficult to precisely form organic EL elements.

It is true that the system by the above ink application step is advantageous in mass-production and increase in screen size compared with other system by a deposition step or the like. However, the specific problem such as described above has not yet been solved. Accordingly, there is a demand for solution of such a problem in order to realize commercialization of organic EL display panels.

In order to solve this problem, there has been taken a measure such as disclosed in Patent Literature 1, for example. Specifically, in a burning step of an applied bank material, a recess is formed on the top of a bank by taking advantage of thermal shrinkage of the bank material, and the ink overflowed beyond an element formation region is held within the recess to prevent color mixture of inks.

CITATION LIST

Patent Literature

[Patent Literature 1] Japanese Patent Application Publication No. 2006-32198

SUMMARY

However, in fact, even with use of the above conventional art, it is difficult to sufficiently prevent the problem of color mixture of inks. The problem is described below with reference to the figure.

FIG. 23 is a cross-sectional view schematically showing an organic EL display panel having the line bank structure immediately after being undergone an application step relating to an conventional art. As shown in FIG. 23, on the top of a bank 13L, a recess 131 has been spontaneously formed beforehand as a result of thermal shrinkage of a bank material. However, in general, an amount of an ink 8X to be applied to each element formation region is remarkably larger than the internal volume of the recess 131, as shown in FIG. 23. Accordingly, in the case where some vibration or acceleration is added to a substrate to which the ink has been applied while being conveyed from an inkjet device, an ink collection 10X held within the recess 131 overflows to the outside beyond the recess 131 with relative ease. As a result, color mixture sometimes occurs between adjacent inks 8X as shown in FIG. 23.

This problem that an ink overflows beyond the bank to enter an element formation region of a different light emitting color might occur in an organic EL display panel having the pixel bank structure, in the same manner as in the organic EL display panel having the line bank structure. Furthermore, this problem might also occur in the case where an ink containing a material of an organic light-emitting layer, an ink containing a material of other hole transport layer, and so on, are applied to each element formation region. Therefore, there is a demand for quick solution of the problem.

In view of the above problem, one non-limiting and exemplary embodiment provides an applying-type organic EL display panel and a method of manufacturing thereof that are expected to exhibit an excellent image display capability, by appropriately preventing color mixture of inks due to overflow of an ink containing an organic light-emitting material and so on beyond a bank to enter a different element formation region.

In one general aspect, the techniques disclosed here feature an organic EL display panel comprising: a substrate; an interlayer insulating layer that is provided on the substrate; first electrodes that are provided on the interlayer insulating layer so as to correspond one-to-one to element formation regions arranged in rows and columns above the substrate; banks that are provided extending in columns to partition the element formation regions arranged in rows; organic light-emitting layers that are provided above the first electrodes in one-to-one correspondence, and each contain an organic light-emitting material having a light-emitting color differing between each two adjacent element formation regions arranged in rows; and second electrodes that are provided above the organic light-emitting layers in one-to-one correspondence, and are opposite in polarity to the first electrodes, wherein the interlayer insulating layer has a first opening that corresponds in position to an interval between each two adjacent first electrodes in rows, the banks each have a buried part and a main part that are integrally formed, the buried part fills the interval and the first opening, and the main part is a protrusion of the buried part, and the main part has, on a top thereof, a first recess along with respective shapes of the interval and the first opening.

According to the organic EL display panel having the above structure, the bank has the buried part that fills the interval between each two adjacent first electrodes in rows and the first opening formed in the interlayer insulating layer (planarizing film). Also, the first recess is formed on the top of the main part along with the respective shapes of the interval and the first opening. With the above structure, the first recess is formed in accordance with the depth of the first opening. Accordingly, it is possible to appropriately form the first recess having a sufficient depth by adjusting beforehand the first opening to have a large depth. Therefore, it is possible to remarkably increase the depth of the first recess and accurately adjust the depth of the first recess, compared with a conventional method according to which a resist material of a bank is applied to a surface of a planarized interlayer insulating layer, and a recess with a small depth is formed by taking advantage of spontaneous shrinkage of the bank material. With the above creativity, even if an ink containing an organic light-emitting material applied to the substrate overflows due to vibration or acceleration resulting from conveying the substrate, the ink overflowed beyond an element formation region is effectively held within the first recess having a sufficient depth. This prevents color mixture of inks, thereby excellently manufacturing an organic EL display panel.

Also, by forming the buried part in the first opening having a sufficient depth formed in the interlayer insulating layer between each two adjacent first electrodes, the bank is provided tightly toward the substrate owing to so-called the spike effect. Accordingly, the edge of each of the first electrodes is forced toward the substrate by a surface of the main part along the substrate, which is formed integrally with the buried part. This improves the adhesion between the surface of the main part of the bank and the first electrode adjacent the surface and the adhesion between the surface of the main part of the bank and the interlayer insulating layer adjacent the surface, thereby suppressing uplift and detachment of the first electrode from the surface of the interlayer insulating layer. As a result, the first electrode is certainly fixed. Also, the buried part is positioned between each two adjacent first electrodes. The buried part certainly insulates between each two adjacent first electrodes, thereby leading to an expectation of improvement in operative reliability of the display panel.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 5 is a partial cross-sectional view showing the structure of an organic EL display panel having an applying-type HIL relating to Embodiment 2.

FIG. 7 is a partial enlarged view showing the structure of an organic EL display panel having the line bank structure relating to Embodiment 4.

FIG. 8 is a partial enlarged view showing the structure of an organic EL display panel having the pixel bank structure relating to Embodiment 5.

FIG. 9 is a partial enlarged view showing the structure of an organic EL display panel having the pixel bank structure relating to Embodiment 6.

DETAILED DESCRIPTION

Embodiments

Figure 1:
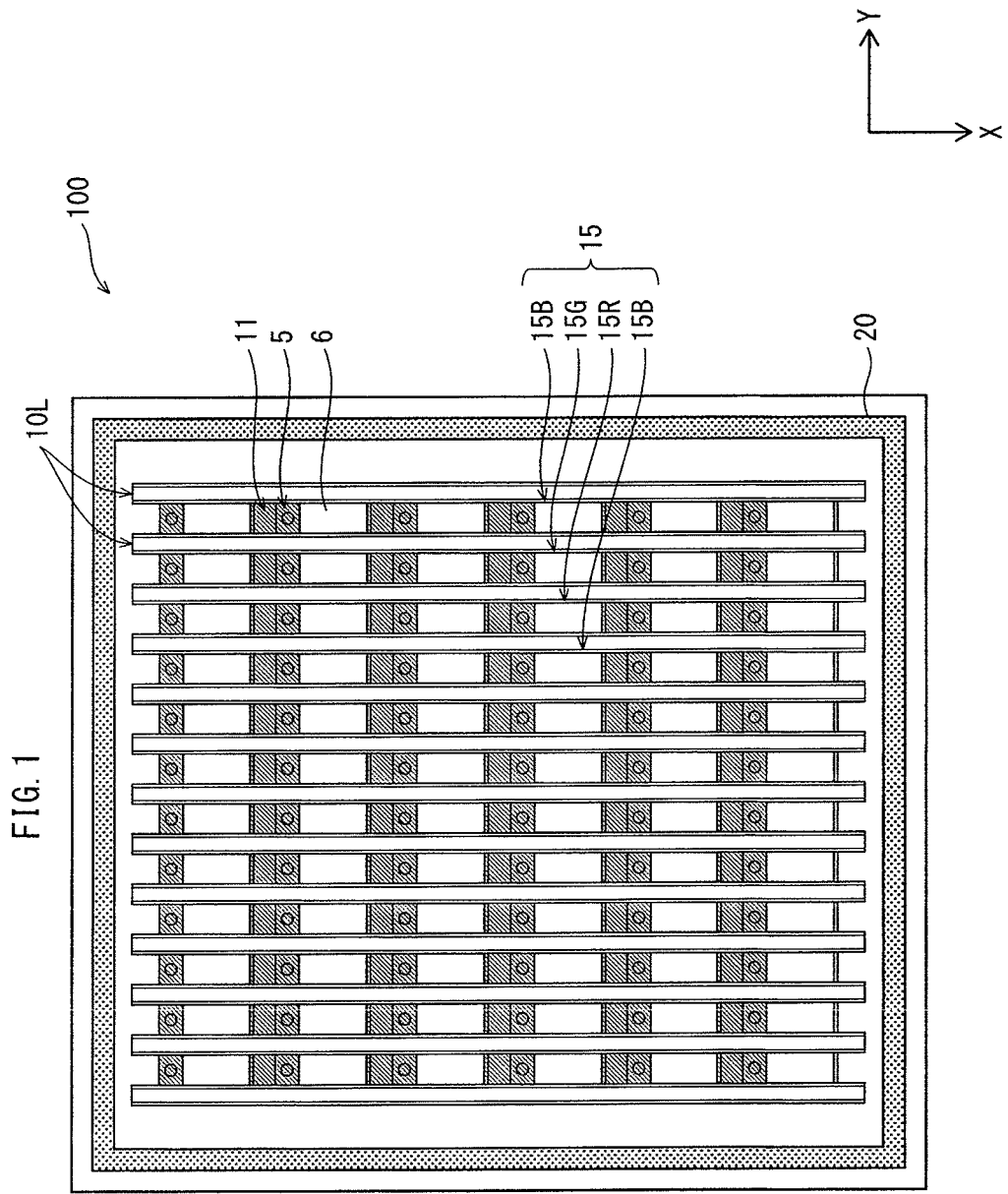
FIG. 1 is a top view showing the structure of an organic EL display panel having the line bank structure relating to Embodiment 1.

According to one aspect of the present invention, an organic EL display panel comprises: a substrate; an interlayer insulating layer that is provided on the substrate; first electrodes that are provided on the interlayer insulating layer so as to correspond one-to-one to element formation regions arranged in rows and columns above the substrate; banks that are provided extending in columns to partition the element formation regions arranged in rows; organic light-emitting layers that are provided above the first electrodes in one-to-one correspondence, and each contain an organic light-emitting material having a light-emitting color differing between each two adjacent element formation regions arranged in rows; and second electrodes that are provided above the organic light-emitting layers in one-to-one correspondence, and are opposite in polarity to the first electrodes, wherein the interlayer insulating layer has a first opening that corresponds in position to an interval between each two adjacent first electrodes in rows, the banks each have a buried part and a main part that are integrally formed, the buried part fills the interval and the first opening, and the main part is a protrusion of the buried part, and the main part has, on a top thereof, a first recess along with respective shapes of the interval and the first opening.

According to the organic EL display panel having the above structure, the bank has the buried part that fills the interval between each two adjacent first electrodes in rows and the first opening formed in the interlayer insulating layer (planarizing film). Also, the first recess is formed on the top of the main part along with the respective shapes of the interval and the first opening. Accordingly, the depth of the first recess is adjusted in accordance with the depth of the interlayer insulating layer. As a result, it is possible to form the first depression having a sufficient depth by adjusting beforehand the depth of the first opening. This makes it possible to remarkably set the first recess to have a large depth compared with accuracy, with conventional art. even if an ink applied to each element formation region overflows due to vibration or acceleration resulting from conveying the substrate, the overflowed ink is effectively held within the first recess having a sufficient depth. This prevents color mixture of inks, thereby excellently manufacturing an organic EL display panel.

In addition to the above effect, the following effect is exhibited. By forming the buried part in the first opening having a sufficient depth formed in the interlayer insulating layer between each two adjacent first electrodes, the bank is provided tightly toward the substrate owing to so-called the spike effect. Accordingly, the edge of each of the first electrodes is forced toward the substrate by the bottom surface of the main part, which is formed integrally with the buried part. This improves the adhesion between the first electrode and the interlayer insulating layer, thereby suppressing uplift and detachment of the first electrode from the interlayer insulating layer. As a result, the first electrode is certainly provided. Furthermore, the buried part is positioned between each two adjacent first electrodes. The buried part certainly insulates between each two adjacent first electrodes, thereby leading to an expectation of improvement in operative reliability of the organic EL display panel.

According to another aspect of the present invention, the organic light-emitting layers each may result from applying an ink containing the organic light-emitting material to one of the element formation regions, and drying the applied ink.

In the case where the organic light-emitting layer is formed by applying an ink such as described above, it is possible to appropriately hold, within the first recess formed in the main part, an ink overflowed beyond an element formation region, thereby appropriately preventing color mixture of inks.

According to another aspect of the present invention, the banks may be arranged in parallel rows at predetermined intervals.

With the above structure of the organic EL display panel having so-called the line bank structure in which banks extending in the same direction are arranged in parallel, it is possible to appropriately prevent color mixture of inks between each two adjacent element formation regions with a bank interposed therebetween, by providing the first recess on the top of the main part.

According to another aspect of the present invention, the first recesses may be formed in columns.

The above structure enables formation of the first recess having a sufficient volume. Accordingly, it is possible to hold a large amount of ink overflowed beyond the element formation region, thereby more effectively preventing color mixture of inks.

According to another aspect of the present invention, the organic EL display panel may further comprise banks that are provided extending in rows to partition the element formation regions arranged in columns.

With the above structure of the organic EL display panel having so-called the line bank structure in which banks are formed in rows and columns so as to form a lattice shape, it is possible to prevent color mixture of inks applied to element formation regions of different light-emitting colors, by forming the first recess in the main part.

In this case, according to another aspect of the present invention, the interlayer insulating layer may have further provided therein a second opening that corresponds in position to an interval between each two adjacent first electrodes in columns, the banks extending in rows each may have a buried part and a main part that are integrally formed, the buried part may be filled in the interval in columns and the second opening, and the main part may be a protrusion of the buried part, and the main part may have, on a top thereof, a second recess along with the respective shapes of the interval in columns and the second opening.

With the above structure of the organic EL display panel having the pixel bank structure in which recesses, namely the first recess and the recess, are formed in the main part of respective banks in columns and rows, respectively. This prevents color mixture of inks having different light-emitting colors, and prevents overflowing of inks in both columns and rows. This leads to expectation of an effect of uniformization of amount of inks in each element formation region.

According to another aspect of the present invention, the first recess may have higher lyophilicity than a surface of the main part.

According to another aspect of the present invention, the second recess may have higher lyophilicity than a surface of the main part.

With the above structure of the organic EL display panel, at least one of the first recess and the second recess has lyophilicity. Accordingly, in the case where an ink containing an organic light-emitting material overflows into the first recess or the second recess, the surface of the first recess or the second recess into which the ink overflowed contacts the overflowed ink with a high wettability, thereby appropriately forming an ink collection. Accordingly, it is possible to hold a large amount of overflowed ink within the first recess or the second recess having lyophilicity, thereby more effectively preventing color mixture of inks.

Here, the "lyophilicity" means lyophilicity to an ink containing an organic light-emitting material. Specifically, in the case where the ink is aquatic, the "lyophilicity" indicates "hydrophilicity".

Note that at least one of the first recess and the second recess has lyophilicity, and the surface of the main part other than the first recess and the second recess has lyophobicity. This prevents broad adherence of the ink to the surface of the main part. Therefore, the ink is appropriately held within an element formation region between each two adjacent banks. This leads to expectation of an effect of preventing overflow of the ink beyond the element formation region.

According to another aspect of the present invention, the organic EL display panel may further comprise one or more functional layers that are provided between the first electrodes and the organic light-emitting layers, wherein the functional layers each may include a charge injection transport layer for injecting or transporting charge, and the charge injection transport layer may directly contact the first electrodes and cover the interval between each two adjacent first electrodes in rows and an inner periphery of each of the first openings.

With the above structure of providing the charge injection transport layer, the buried part of the bank is provided in the first opening. Accordingly, both the first electrode and the charge injection transport layer are forced toward the substrate by the bottom surface of the main part, which is formed integrally with the buried part. This prevents uplift and detachment of the first electrode and the charge injection transport layer.

According to another aspect of the present invention, the organic EL display panel may further comprise one or more functional layers that are provided between the first electrodes and the organic light-emitting layers, wherein the functional layers each may include a charge injection transport layer for injecting or transporting charge, and the banks each may contact the interval between each two adjacent first electrodes in rows and an inner periphery of each of the first openings.

With the above structure, it is possible to form a charge injection transport layer, which is no contact with the inside of the first opening, by applying an ink containing a material of the charge injection transport layer in the same manner as that of the organic light-emitting layer.

According to another aspect of the present invention, the first recess may have a depth equivalent to 10% to 100% of a length from an upper surface of the interlayer insulating layer to the top of the main part.

With the above structure of adjusting the depth of the first recess, it is possible to appropriately hold an ink overflowed beyond each element formation region. Similarly, the second recess may have a depth equivalent to 10% to 100% of a length from an upper surface of the interlayer insulating layer to the top of the main part.

According to another aspect of the present invention, a method of manufacturing an organic EL display panel, comprises: an interlayer insulating layer forming step of forming an interlayer insulating layer on a substrate; a first electrode forming step of forming first electrodes on the interlayer insulating layer so as to correspond one-to-one to element formation regions arranged in rows and columns above the substrate; a bank forming step of forming banks so as to extend in columns to partition the element formation regions arranged in rows; an organic light-emitting layer forming step of forming organic light-emitting layers above the first electrodes in one-to-one correspondence, by applying inks that each contain an organic light-emitting materials and drying the applied inks; and a second electrode forming step of forming second electrodes above the organic light-emitting layers in one-to-one correspondence so as to be opposite in polarity to the first electrodes, wherein in the interlayer insulating layer forming step, the interlayer insulating layer is formed by a photoresist method so as to have provided therein a first opening that corresponds in position to an interval between each two adjacent first electrodes in rows, in the organic light-emitting layer forming step, the organic light-emitting layers are formed so as to each contain an organic light-emitting material having a light-emitting color differing between each two adjacent element formation regions arranged in rows, and in the bank forming step, the banks are each formed by filling a buried part in the interval and the first opening and forming a main part integrally with the buried part, and a first recess is formed by recessing a top of the main part along with respective shapes of the interval and the first opening.

With the above method of manufacturing the organic EL display panel, even if an ink containing an organic light-emitting material applied above each first electrode overflows due to vibration or acceleration resulting from conveying the substrate, the overflowed ink is effectively held within the first recess on the top of the main part. This prevents color mixture of inks applied to element formation regions having different light-emitting colors.

According to another aspect of the present invention, after the bank forming step is performed, lyophilic processing may be performed on the first recess so as to have a higher lyophilicity than a surface of the main part.

According to another aspect of the present invention, the lyophilic processing may be performed by performing halftone exposure processing or ultraviolet irradiation processing.

According to another aspect of the present invention, the method of manufacturing the organic EL display panel may further comprise, between the first electrode forming step and the bank forming step, a functional layer forming step of forming one or more functional layers over each of the first electrodes, wherein in the functional layer forming step, a charge injection transport layer may be provided as each of the functional layers so as to directly contact the first electrodes and cover the interval between each two adjacent first electrodes in rows and an inner periphery of each of the first openings.

According to another aspect of the present invention, a method of manufacturing an organic EL display panel may comprise: an interlayer insulating layer forming step of forming an interlayer insulating layer on a substrate; a first electrode forming step of forming first electrodes on the interlayer insulating layer so as to correspond one-to-one to element formation regions arranged in rows and columns above the substrate; a bank forming step of forming banks so as to extend in columns to partition the element formation regions arranged in rows; an organic light-emitting layer forming step of forming organic light-emitting layers above the first electrodes in one-to-one correspondence, by applying inks that each contain an organic light-emitting material and drying the applied inks; and a second electrode forming step of forming second electrodes above the organic light-emitting layers in one-to-one correspondence so as to be opposite in polarity to the first electrodes, wherein in the first electrode forming step, a metal film may be formed so as to face the interlayer insulating layer, etching processing may be performed on the metal film to pattern the first electrodes and cut part of the interlayer insulating layer corresponding in position to an interval between each two adjacent electrodes in rows to form a first opening, in the organic light-emitting layer forming step, the organic light-emitting layers may be formed so as to each contain an organic light-emitting material having a light-emitting color differing between each two adjacent element formation regions arranged in rows, and in the bank forming step, the banks each may be formed by filling a buried part in the interval and the first opening and forming a main part integrally with the buried part, and a first recess may be formed by recessing a top of the main part along with respective shapes of the interval and the first opening.

According to another aspect of the present invention, after the bank forming step is performed, lyophilic processing may be performed on the first recess so as to have a higher lyophilicity than a surface of the main part.

According to another aspect of the present invention, the lyophilic processing may be performed by performing halftone exposure processing or ultraviolet irradiation processing.

According to another aspect of the present invention, the method of manufacturing the organic EL display panel may further comprise, between the first electrode forming step and the bank forming step, a functional layer forming step of forming one or more functional layers so as to face each of the first electrodes, wherein in the functional layer forming step, a charge injection transport layer may be provided as each of the functional layers so as to directly contact the first electrodes and cover the interval between each two adjacent first electrodes in rows and an inner periphery of each of the first openings.

Embodiment 1

Structure of Organic EL Display Panel 100

Figure 2:
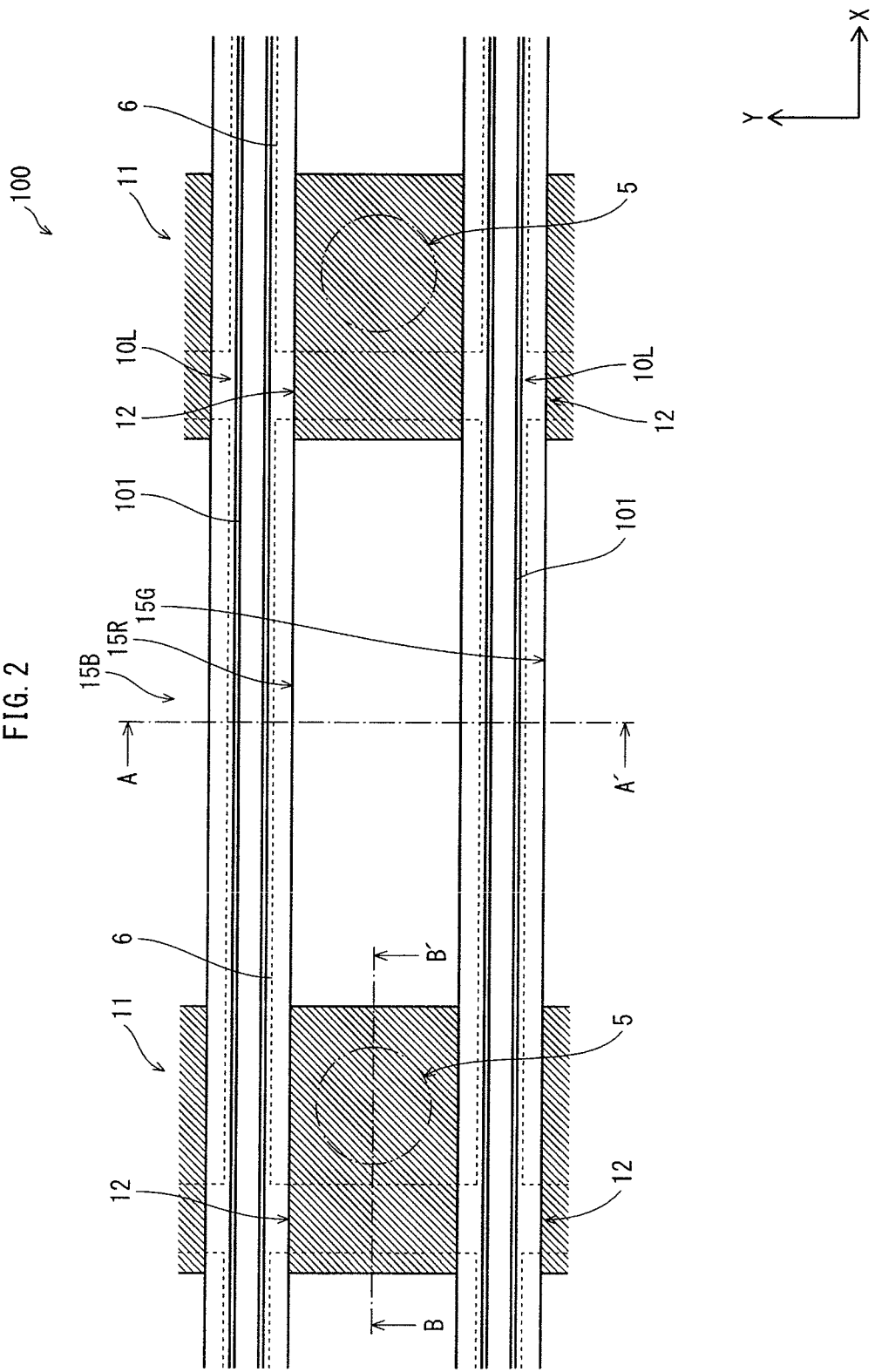
FIG. 2 is a partial enlarged view showing the structure of the organic EL display panel relating to Embodiment 1.

FIG. 1 is a top view showing the structure of a top-emission type organic EL display panel 100 (hereinafter, referred to just as "panel 100") relating to Embodiment 1. FIG. 2 is a partial enlarged view showing the periphery of one organic EL element arranged on the panel 100. For convenience of explanation, the structure of a second electrode (cathode), a passivation layer, and so on arranged above an organic light-emitting layer 8 are omitted in FIG. 1 and FIG. 2. In FIG. 2, dashed lines indicate the shape of a first electrode 6, and two-dot chain lines indicate the shape of a contact hole 5.

According to the panel 100 as shown in FIG. 1, respective element formation regions are arranged in the column direction (X direction) and the row direction (Y direction). Organic EL elements 15 (specifically, 15R, 15G, and 15B) are arranged in a matrix in one-to-one correspondence with the element formation regions. In the row direction (Y direction), the organic EL elements 15R, 15G, and 15B each having an organic light-emitting layer 8 corresponding to a light-emitting color of any one of RGB are repeatedly arranged as sub-pixels. According to the panel 100, a combination of sub-pixels of three colors adjacent in the row direction (Y direction) functions as one pixel. Note that, in FIG. 1, numerical reference 20 indicates a sealing member arranged around the panel 100. Also, although not illustrated, a front panel is placed on the panel 100, and is sealed to the panel 100 via the sealing member 20.

The panel 100 applies so-called the line bank structure in which banks 10L linearly extending in the column direction (X direction) are arranged in stripes in the row direction (Y direction). Between each two adjacent banks 10L, any one of the organic EL elements 15R, 15B, and 15G is arranged plural times. As shown in FIG. 2, organic EL elements 15 of the same color between each two adjacent banks 10L are partitioned by a pixel defining layer (PCL) 11 forming a nonluminescent region (pixel defining region).

Figure 3:
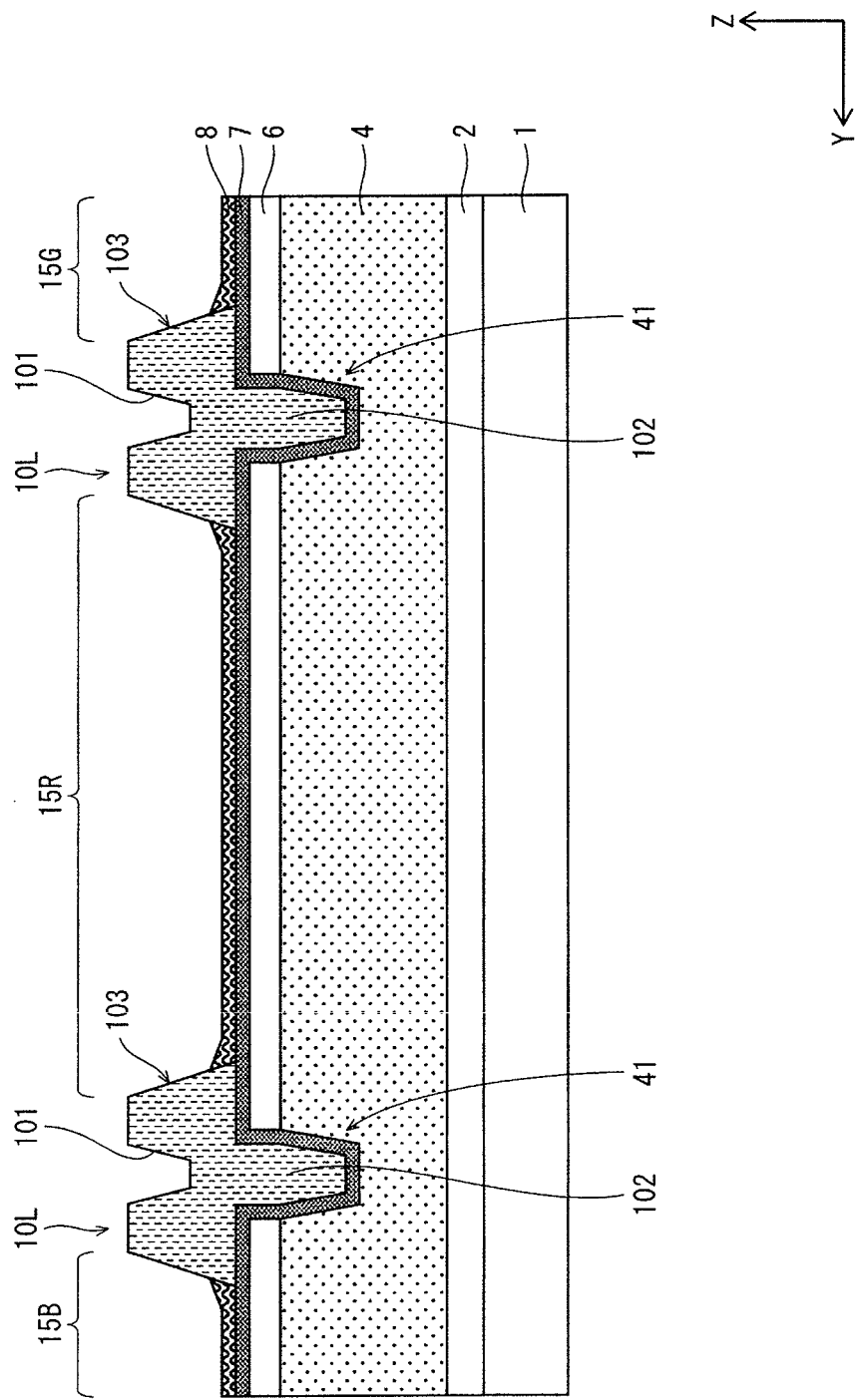
FIG. 3 is a partial cross-sectional view showing the structure of the organic EL display panel relating to Embodiment 1.
Figure 4:
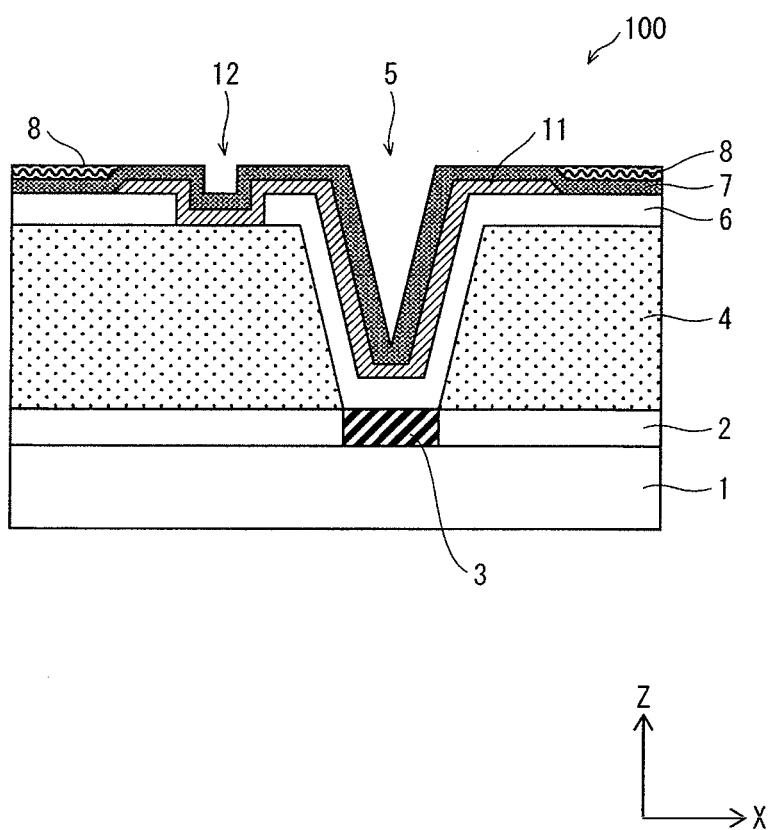
FIG. 4 is an enlarged cross-sectional view showing the structure of the periphery of a contact hole of the organic EL display panel relating to Embodiment 1.

FIG. 3 is a partial cross-sectional view showing the panel 100 taken along line A-A' in FIG. 2 for explaining the layer structure of the periphery of one organic EL element. FIG. 4 is a partial cross-sectional view showing the panel 100 taken along line B-B' in FIG. 2.

As shown in FIG. 3, the panel 100 is formed by layering, on one of main surfaces of a TFT substrate 1 (hereinafter, referred to just as "substrate 1"), a TFT wiring part (TFT layer) 2, a planarizing film (interlayer insulating layer) 4, a first electrode (anode) 6, and a charge injection transport layer 7 in this order. The banks 10L are formed on a surface of the of the charge injection transport layer 7 of the panel 100. Alternatively, in the case where the charge injection transport layer 7 is formed after layering of the banks 10L or in the case where no charge injection transport layer 7 is provided, the bank 10L may be formed directly on the planarizing film 4.

In an element formation region between each two adjacent banks 10L, the organic light-emitting layer 8, the second electrode, and the passivation layer are layered in this order. Note that the second electrode and the passivation layer are not illustrated.

The substrate 1 is a base part of the panel 100, and is formed by any of known insulating materials including alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

The TFT wiring part 2 is formed on the surface of the substrate 1 in order to drive all the organic EL elements 15R, 15G, and 15B arranged on the panel 100 by an active matrix system.

The planarizing film 4 is formed by an organic material having excellent heat resistance properties and insulation properties such as polyimide. The planarizing film 4 is provided in order to cover the TFT wiring part 2 excluding a feed electrode (transparent electrode) 3 provided in the TFT wiring part 2, thereby to planarize the surface of the substrate 1. Note that, as shown in FIG. 4, the planarizing film 4 has therein the contact hole 5 formed by digging down a part thereof corresponding in position to the feed electrode 3 in the thickness direction (Z direction) to form a hole having a circular bottom. This is in order to expose the feed electrode 3 to be electrically connected with the first electrode 6.

The number of contact holes 5 to be formed in each element formation region may be two or more. Also, the contact hole 5 may have a polygonal bottom, instead of the circular bottom such as shown in FIG. 2.

Furthermore, as shown in FIG. 3, in a part of the planarizing film 4 corresponding in position to the interval between each two adjacent first electrodes 6 in the row direction (Y direction), an opening 41 is formed by digging down the part of the planarizing film 4 to a certain depth. The opening 41 is formed as a groove in the column direction (X direction).

The first electrodes 6 are each a rectangle anode electrode having a certain length. As shown in FIG. 1 and FIG. 2, the first electrodes 6 are arranged in matrix for each element formation region so as to be rectangle in the column direction (X direction). The first electrode 6 is formed by layering a transparent conductive film on a surface of a reflective metal film (reflective anode). Most parts of the bottom surface of the first electrode 6 is in contact with the surface of the planarizing film 4. Part of the first electrode 6 penetrates inside the contact hole 5 so as to be electrically connected with the feed electrode 3.

The reflective metal film feeds power to the organic light-emitting layer 8. The reflective metal film is formed by a metal material having an excellent visible-light reflectivity such as aluminum and aluminum alloy in order to effectively extract light generated by the organic light-emitting layer 8 from above. Here, the aluminum alloy is alloy of aluminum and at least one of metal, copper, manganese, zinc, nickel, magnesium, palladium, cobalt, and neodymium.

The transparent conductive film is formed by a known transparent conductive material such as ITO (Indium Tin Oxide) and IZO (Indium Zinc Oxide). The transparent conductive film covers the reflective metal film. This is in order to block the reflective metal film off from oxygen and so on in the atmosphere to prevent the reflective metal film from decreasing in reflectivity and conductivity due to unnecessary coated film formation.

The pixel defining layer 11 is formed by an insulating material such as SiON (silicon oxynitride). As shown in FIG. 1 and FIG. 2, the pixel defining layer 11 is formed on the surface of the charge injection transport layer 7 between each two adjacent element formation regions in the column direction (X direction), so as to be perpendicular to the longitudinal direction of the bank 10L (X direction). A region in which the pixel defining layer 11 is provided is formed as a nonluminescent region as a result of blocking power supply to the first electrode 6 and the second electrode, which is not illustrated, to the organic light-emitting layer 8 when driven.

The charge injection transport layer 7 is one of functional layers provided between the first electrode 6 and the organic light-emitting layer 8. The charge injection transport layer 7 is provided in order to effectively transport charge (hole) fed from the first electrode 6 when driven, and inject the charge into the organic light-emitting layer 8. The charge injection transport layer 7 is formed from a known oxidized material such as molybdenum and tungsten. The charge injection transport layer 7 is provided by a deposition method here. In this case, as shown in FIG. 3, the charge injection transport layer 7 is layered on the first electrode 6 so as to directly contact the top surface of the first electrode 6, and cover the interval between each two adjacent first electrodes 6 in the row direction and the inner surface of the opening 41 of the planarizing film 4.

Note that the functional layer is provided between the first electrode 6 and the organic light-emitting layer 8, as a laminate composed of one or more layers. Accordingly, other functional layer may be layered in addition to the charge injection transport layer 7. Alternatively, instead of the charge injection transport layer 7, two functional layers of a charge injection layer and a charge transport layer are layered in this order from the surface of the first electrode 6.

The organic light-emitting layer 8 is formed by applying an ink containing a predetermined organic light-emitting material corresponding to any one of light-emitting colors of RGB to the surface of the charge injection transport layer 7 and drying the applied ink. As this organic light-emitting material, a known material is available as shown below. The known materials include, for example, materials disclosed in Japanese Patent Application Publication No. 5-163488 including oxinoid compound, perylene compound, coumarin compound, azacouramin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-2'-bipyridine compound, complex of a Schiff base and group III metal, oxine metal complex, phosophor such as rare earth complex, and so on.

The banks 10L are each formed from an insulating organic material such as acrylic resin, polyimide resin, and novolac-type phenolic resin. The banks 10L linearly extend in the column direction (X direction) each so as to partition each two adjacent element formation regions in the Y direction. Also, the banks 10L are arranged at regular intervals in stripes in the Y direction. The panel 100 has the following characteristics. The bank 10L is composed of a buried part 102 resulting from burying a bank material in the opening 41 formed in the planarizing film 4 and the interval between each two adjacent first electrodes 6 in the row direction (Y direction) and a main part 103 resulting from uplifting the bank material from the buried part 102. On the top of the main part 103, a recess 101 is formed by recessing down the bank material that forms the buried part 102 along with the shape of the interval between each two adjacent first electrodes 6 in the row direction (Y direction) and the shape of the inner surface of the opening 41 of the planarizing film 4.

Figure 22:
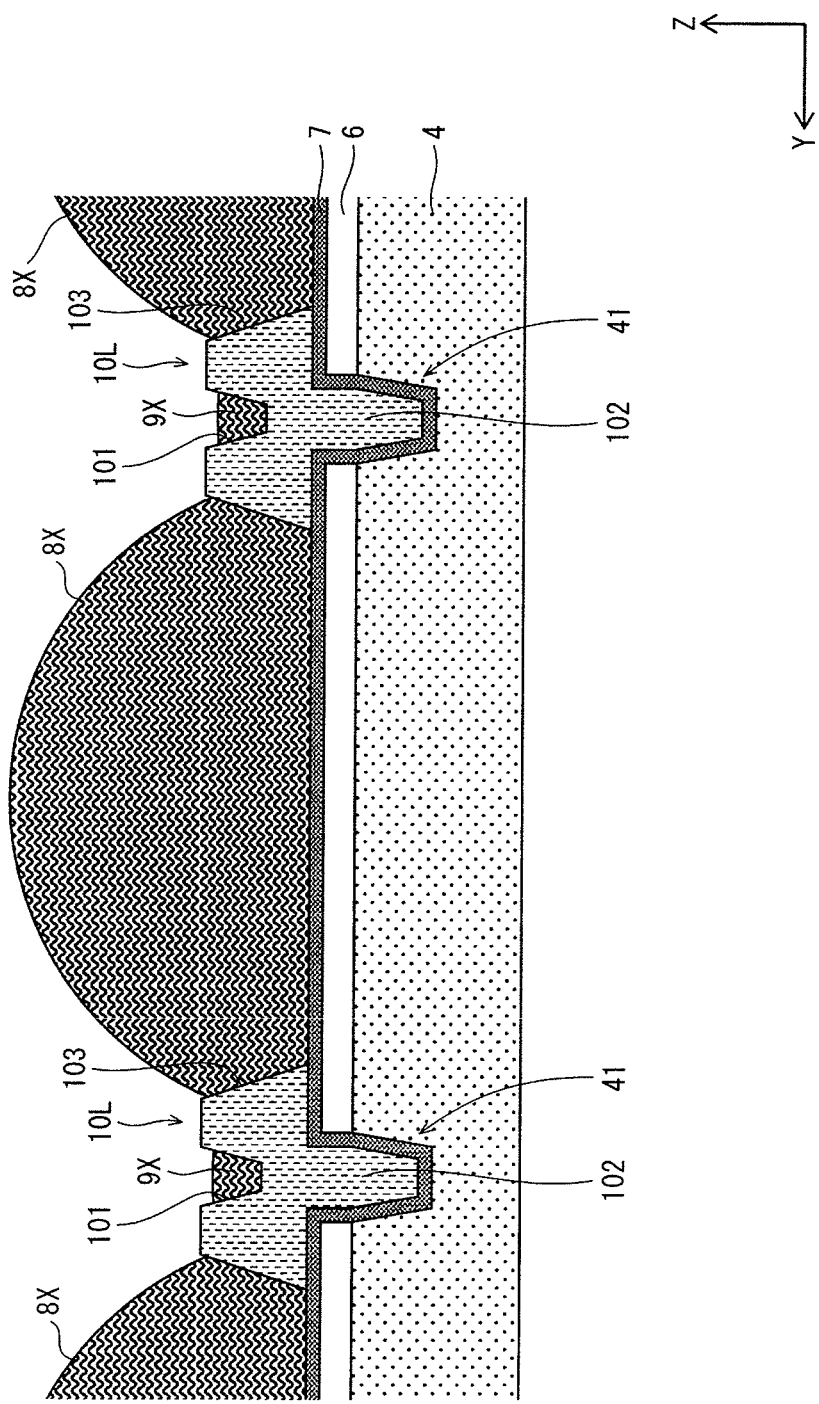
FIG. 22 is a cross-sectional view for explaining an effect exhibited by Embodiment 1 of prevention of color mixture of inks.
Figure 23:
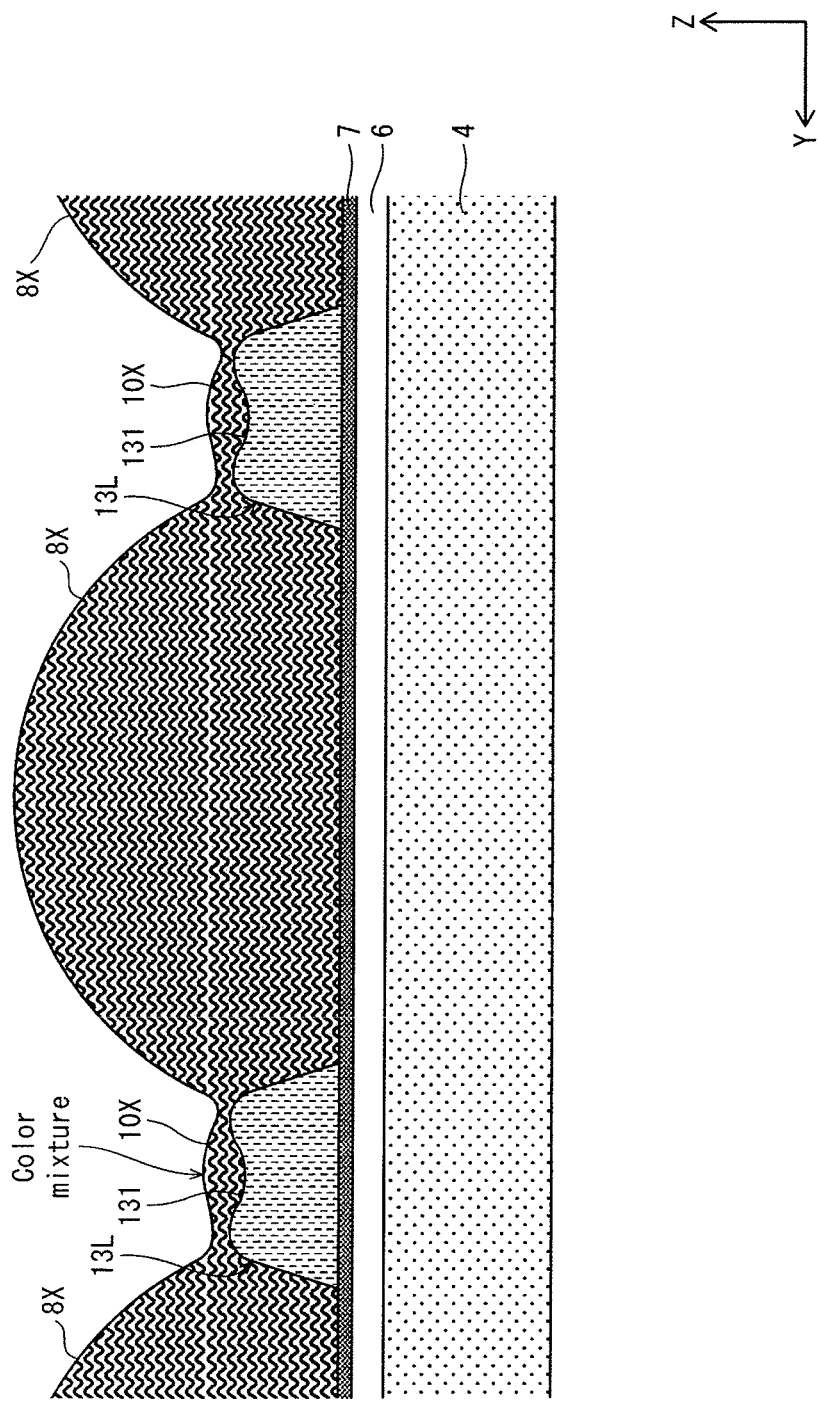
FIG. 23 is a cross-sectional view for explaining a conventional problem (color mixture of inks).

The recesses 101 are overall grooves formed in lines in the longitudinal direction of the bank 10L (column direction, namely, X direction). The recesses 101 are formed in order to prevent color mixture of inks. Specifically, in the process of manufacturing the panel 100, in the case where an ink containing an organic light-emitting material is applied to each element formation region as a material of the organic light-emitting layer 8, the applied ink might overflow beyond the element formation region. In such a case, it is necessary to appropriately hold the overflowed ink, and prevent color mixture of inks between element formation regions each having a different light-emitting colors partitioned by the bank 10L. Lyophilic processing is performed on the inner surface of the recess 101 in order to appropriately hold the ink overflowed beyond the element formation region as an ink collection 9X (FIG. 22). Compared with this, the surface of the main part 103 excluding the recess 101 is water-repellent, and the ink is dried so as to be on the element formation region as a uniform applied film.

The shape of the recess 101 is determined so as to along with the shape of the interval between each two adjacent first electrodes 6 and the shape of the opening 41. Accordingly, the depth (recess depth) of the recess 101 is proportional to the depth of the opening 41. The recess 101 desirably has a depth sufficient for appropriately holding the ink that has overflowed described above. For example, it is appropriate to set the recess 101 to have a depth equivalent to 10% to 100% of the height from the surface of the planarizing film 4 to the top of the main part 103.

Next, the second electrode layered on the organic light-emitting layer 8 is formed by ITO, IZO, or the like. Because the panel 100 is top-emission type, the second electrode needs to be formed from a light transmissive material.

On the second electrode, a known passivation layer (sealing layer) is provided. The passivation layer is formed from SiN (silicon nitride), SiON, or the like, and suppresses deterioration of the organic light-emitting layer 8 due to exposure to liquid, air, and so on. The passivation layer also needs to be formed from a light transmissive material.

(Structure Example of Display Device)

Figure 20:
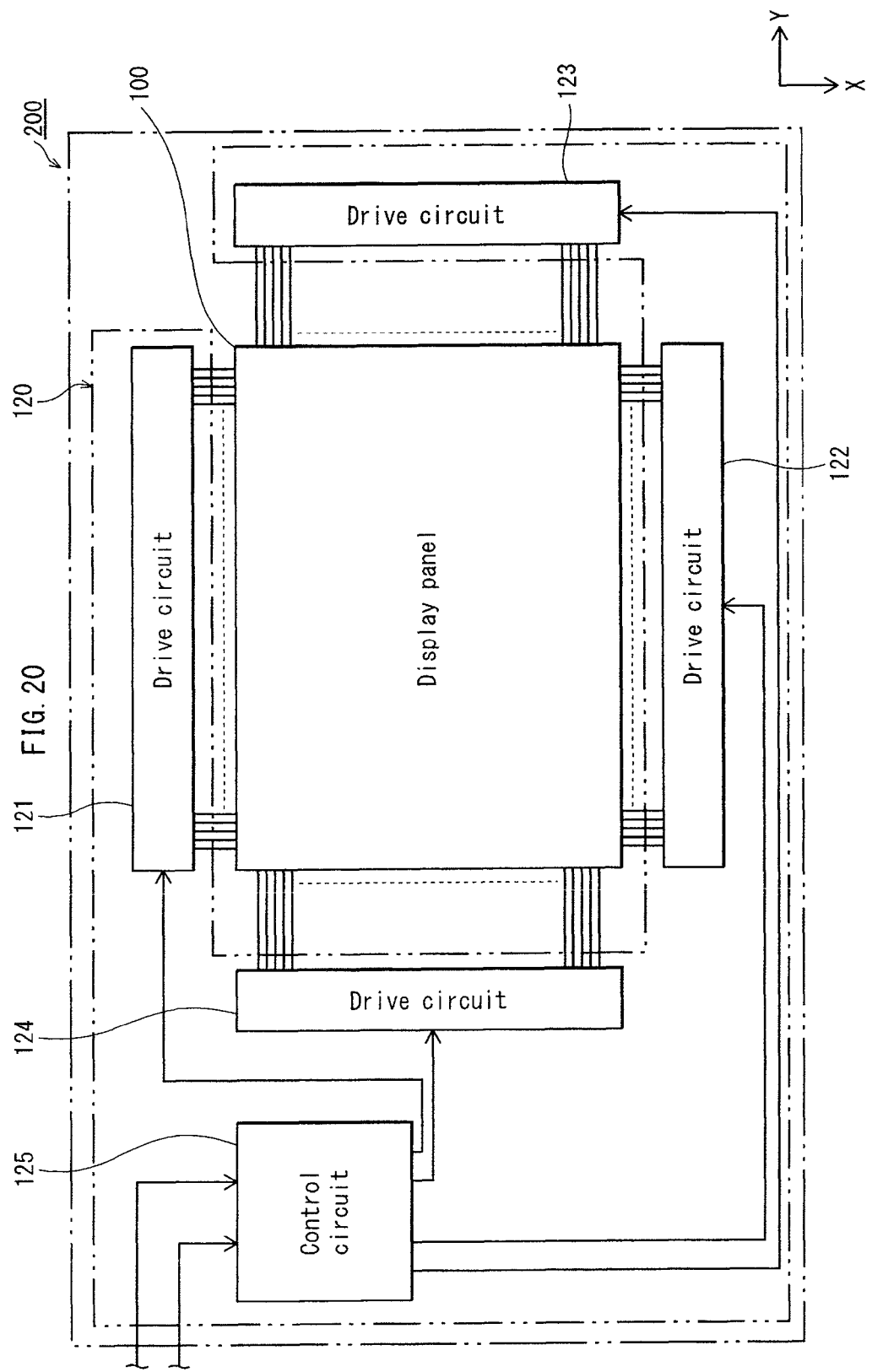
FIG. 20 shows the wiring of a display device.

FIG. 20 shows the structure of a display device 200 with use of the panel 100.

The display device 200 includes the panel 100 and a drive control unit 120 connected with each other. The drive control unit 120 is composed of four drive circuits 121 to 124 and a control circuit 125.

Figure 21:
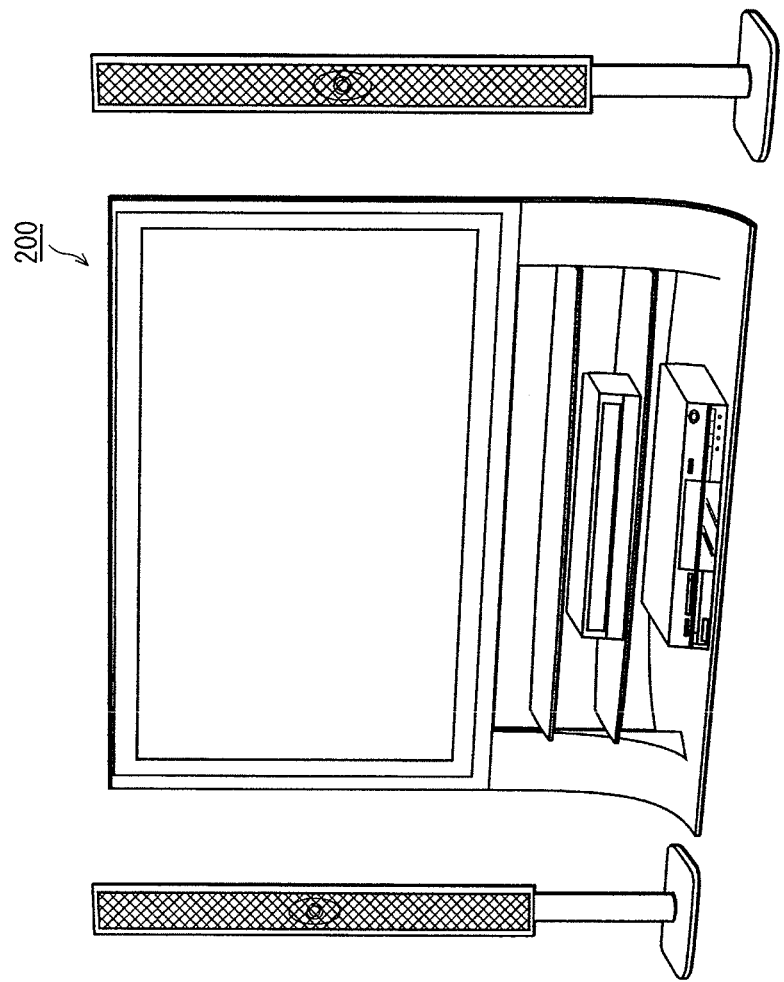
FIG. 21 shows an example of the visual appearance of a TV system with use of the display device.

FIG. 21 shows an example of the visual appearance of a TV system with use of the display device 200.

(Effects of Panel 100)

According to the panel 100 having the above structure, the organic light-emitting layers 8 each having a different light-emitting color to be provided above the organic EL elements 15R to 15B are appropriately formed so as to prevent color mixture of inks containing organic light-emitting materials with use of the recess 101 of the bank 10L in the step of manufacturing the panel 100. This exhibits an excellent image display capability.

Specifically, in the application step by the inkjet method, the organic light-emitting layer 8 is fox by generally applying an ink containing an organic light-emitting material and a solvent and evaporating and drying a solvent component of the ink. Here, the recess 101 is formed, not by taking advantage of volume shrinkage of the bank material due to baking processing of the bank 10L, but by making adjustment to have a sufficient depth (volume) in accordance with the shape of the opening 41 formed in the planarizing film 4 and the shape of the interval between each two adjacent first electrodes 6 in the column direction (Y direction). Accordingly, as shown in FIG. 22, even if a large amount of ink applied to each element formation region overflows beyond the element formation region due to vibration or acceleration resulting from conveying the substrate 1, the overflowed ink enters the recess 101 having a sufficient depth (volume), and the ink is appropriately held within the recess 101 as the ink collection 9X. This suppress further overflow of the ink beyond the bank 10L into other element formation region. Accordingly, it is possible to prevent color mixture of applied inks each having a different light-emitting color partitioned by the bank 10L, and excellently form the organic light-emitting layers 8, thereby realizing the panel 100 having an excellent image display capability.

Furthermore, the panel 100 has the structure in which the buried part 102 is formed in the opening 41 having a sufficient depth formed in part of the planarizing film 4 between each two adjacent first electrodes 6 in the column direction (Y direction). As a result, the bank 10L is provided tightly toward the substrate 1 owing to so-called the spike effect. Accordingly, upon being forced from the bottom surface of the main part 103 (the surface of the main part 103 along the substrate 1), which is formed integrally with the buried part 102, the edge of the first electrode 6 and the edge of the charge injection transport layer 7 are forced toward the substrate 1. This suppress uplift and detachment of the first electrode 6 and the charge injection transport layer 7 from the surface of the planarizing film 4 and the surface of the first electrode 6, respectively. As a result, it is possible to improve the adhesion between the first electrode 6 and the planarizing film 4 and the adhesion between the first electrode 6 and the charge injection transport layer 7, thereby appropriately providing the first electrode 6, the planarizing film 4, and the charge injection transport layer 7.

The panel 100 has the structure in which the inner periphery of the opening 41 is covered by the charge injection transport layer 7. The buried part 102 has a large area in contact with the charge injection transport layer 7 corresponding to the area of the covered inner periphery of the opening 41. As a result, the charge injection transport layer 7 stably maintains both an excellent adhesion between the charge injection transport layer 7 and the buried part 102 and an excellent adhesion between the charge injection transport layer 7 and the first electrode 6.

Furthermore, the panel 100 has the structure in which the buried part 102 is positioned between each two adjacent first electrodes 6 in the row direction (Y direction). This certainly insulates between each two adjacent first electrodes 6, thereby leading to an expectation of improvement in operative reliability of the panel 100.

The recess 101 having sufficient depth and shape is formed by adjusting the depth of the opening 41 formed in the planarizing film 4. The adjustment of the depth of the recess 101 is detailed later.

(Method of Manufacturing Organic EL Display Panel 100)

The following exemplifies the outline of a method of manufacturing the organic EL display panel 100 with reference to FIG. 11 to FIG. 14. For simplification of explanation, the substrate 1, the TFT layer 2, and the feed electrode 3 are omitted in FIG. 11 to FIG. 14. Also, FIG. 11 to FIG. 13 each show, on the left, a Y-Z cross-sectional view showing the peripheral region of the bank 10L (recess 101), and each show, on the right, an X-Z cross-sectional view showing the peripheral region of the contact hole 5.

The following manufacturing method is naturally just an example. Other manufacturing method is of course applicable. Although the method of manufacturing the panel 100 is mainly described here, panels 100A to 100E which are described later are also manufactured basically in the same manner.

(Step of Preparing Substrate)

Firstly, a substrate 1 is prepared, and is placed inside a chamber of a sputtering film forming device. Then, a predetermined sputtering gas is introduced into the chamber to form a TFT layer 2 such as shown in FIG. 3 and a feed electrode 3 by a reactive sputtering method.

(Step of Forming Planarizing Film: First Method)

By a photoresist method, an organic material (planarizing film material 4X) containing a known light curable resin having excellent insulation properties is uniformly applied above the TFT layer 2 and the feed electrode 3 so as to have a final thickness of approximately 4 μm (FIG. 11(a)).

Then, a predetermined photomask PM1 is placed above a surface of the planarizing film material 4X, which has been applied. On a part in which an opening 41 is to be formed, a halftone window is placed. On a part in which a contact hole 5 is to be formed, an opening window is placed. Then, exposure processing is performed from the outside (FIG. 11(b)). Then, photograph processing is performed. As a result, a recess having a certain depth is formed on the part in which the opening 41 is to be formed, and an opening is formed on the part in which the contact hole 5 is to be formed (FIG. 11(c)). Note that placement of the halftone windows is one meaning for adjusting the depth of the opening 41. The increase in exposure amount of the halftone windows adjusts the opening 41 to have large depth. Then, baking processing is performed. As a result, the opening 41 and the contact hole 5 are formed, and this completes a planarizing film 4 (FIG. 11(d)).

Although described later, with respect to the panels 100A to 100C having the line bank structure and the panels 100D to 100F having the pixel bank structure, it is possible to form the planarizing film 4 in the same manner as that described above by adjusting each of the position (pattern) and the light transmissivity of the halftone window of the photomask PM1, and adjusting beforehand the depth and the shape of the opening 41 to be formed.

(Step of Forming First Electrode: First Method)

Next, a metal film 6X having a thickness of approximately 50 nm is uniformly formed above the planarizing film 4 by a vacuum deposition method or a sputtering method (FIG. 11(e)). Then, a resist PR1 containing a photodegradable resin is uniformly applied above the metal film 6X (FIG. 11(f)), and exposure processing is performed on the applied photodegradable resin via a photomask PM2 having an opening window in a position corresponding to the opening 41 (FIG. 11(g)). Then, photograph processing is performed (FIG. 11(h)). As a result, a portion of the resist PR1 corresponding in position to the opening 41 is peeled off. Furthermore, etching processing is performed (FIG. 11(i)) to peel off a remaining portion of the resist PR1. As a result, an edge of the metal film 6X facing the opening 41 is cut. This completes the first electrode 6 provided so as to cover the inside of the contact hole 5 (FIG. 11(j)).

Note that the following second method is applicable to the step of forming the planarizing film 4 and the step of forming the first electrode. The second method has the characteristics that the surface of the planarizing film 4 that has been planarized once is etched in accordance with the patterning of a first electrode 6 to provide the opening 41.

(Step of Forming Planarizing Film: Second Method)

As the same manner as shown in FIG. 12(a), the planarizing film material 4X is uniformly applied above the TFT layer 2 and the feed electrode 3 by the photoresist method so as to have a final thickness of approximately 4 μm (FIG. 12(a)).

Next, on the surface of the applied planarizing film material 4X, an opening window is placed on a part in which the contact hole 5 is to be formed, and a photomask PM1 is provided so as to completely shield light in the part in which an opening 41 is to be formed. Then, exposure processing is performed from the outside (FIG. 12(b)). Then, photograph processing is performed. As a result, the part in which the opening 41 is to be formed is still planarized, and an opening is formed on the part in which the contact hole 5 is to be formed (FIG. 12(c)). Then, baking processing is performed. As a result, the contact hole 5 is formed, and this completes the planarizing film 4 (FIG. 12(d)).

(Step of Forming First Electrode: Second Method)

In the same manner as shown in FIG. 11(e) to (g), a metal film 6X is formed, a resist PR1 is uniformly formed above the metal film 6X, and then exposure processing is performed on the resist PR1 via the photomask PM2 (FIG. 12(e) to (g)). Photograph processing is performed. As a result, the metal film 6X is exposed in the part in which the opening 41 is to be formed (FIG. 12(h)). Next, first etching processing is performed by wet-etching to pattern the metal film 6X to form the first electrode 6 (FIG. 12(i)). Here, the planarizing film 4 between each two adjacent first electrodes 6 in the Y direction is exposed. Then, second etching processing is performed by wet-etching or dry-etching to cut the exposed planarizing film 4 in the thickness direction (FIG. 12(j)). Here, it is possible to increase the depth of the opening 41 proportional to the strength and processing time period of the second etching processing. Then, the resist PR1 is peeled off to form the opening 41 in the same manner as shown in FIG. 11(j), and also a substrate on which the first electrode 6 is formed is completed (FIG. 12(k)).

After the step of forming first electrode by the first method or the second method described above, a step of forming functional layer is performed.

(Step of Forming Pixel Defining Layer)

An inorganic oxide (insulator) such as SiON is uniformly formed above the surface of the substrate 1 by the vacuum deposition method. A pixel defining layer 11 is formed on the surface of the inorganic oxide between each two element formation regions in the column direction (X direction) by the photoresist method. Specifically, a resist material containing a photodegradable resin is uniformly applied above the surface of the substrate 1 on which the functional layer is formed. Then, a photomask is provided such that an opening window is arranged in a position other than a position corresponding to the interval between the element formation regions. Photograph processing is performed. As a result, a resist film whose parts excluding the interval between each two adjacent element formation regions are exposed in stripes is formed in the row direction (Y direction).

Etching processing is performed to remove the inorganic oxide formed other than on the element formation regions and peel off the resist film. As a result, the pixel defining layer 11 having the pattern shown in FIG. 2 is formed.

(Step of Forming Functional Layer)

A charge injection transport layer 7 is formed as a functional layer on the first electrode 6. The charge injection transport layer 7 is formed by a reactive sputtering method. Specifically, the charge injection transport layer 7 is formed by using a metal material such as molybdenum and tungsten as a sputter source (target) and introducing argon gas and oxygen gas as sputtering gas and reactive gas into the chamber, respectively into the chamber (FIG. 13(a)). Then, anneal processing is performed. As a result, the charge injection transport layer 7 is formed by oxide such as molybdenum and tungsten (FIG. 13(b)). With use of the reactive sputtering method that is one type of thin film formation methods, the charge injection transport layer 7 is uniquely formed on the inner circumferential surface of the opening 41 and the surface of the first electrode 6 in the contact hole 5.

(Step of Forming Bank)

As a bank material, a fluorine resist material or an acrylic resist material containing light curable resin is prepared, for example. The prepared bank material is uniquely applied above the surface of the charge injection transport layer 7 (FIG. 13(c)). Here, parts of the resist material applied to the opening 41 and the contact hole 5 are recessed down along with the respective shapes of the opening 41 and the contact hole 5 (FIG. 13(c)).

Furthermore, a photomask PM3 is provided on the applied material 10X, and exposure processing is performed such that light enters the position corresponding to the opening 41 via the opening window (FIG. 13(d)). Then, photograph processing is performed. As a result, part of the resist material 10X that does not correspond in position to the opening 41 is removed (FIG. 13(e)). Then, baking processing is performed. This completes the banks 10L in lines each having the buried part 102, the main part 103, and the recess 101 (FIG. 13(f)).

Each of the panels 100A to 100F which are described later is recessed down along with the opening 41 having the predetermined depth and shape which has been already formed (FIG. 13(c)). As a result, banks 10P and 10L having any of a predetermined recess 101, 101X, 101Y, and so on are formed.
(Step of Lyophilic Processing)

A resist PR2 containing photodegradable resin is applied to the surface of the bank 10L formed as described above (FIG. 14(a)). A photomask PM4 having an opening window is provided in a position corresponding to the recess 101, and exposure processing is performed (FIG. 14(b)). Then, photograph processing is performed to remove resist that has not yet been cured. As a result, only the recess 101 is exposed the outside (FIG. 14(c)). Then, lyophilic processing is performed. Specifically, ultraviolet irradiation is performed with use of high-pressure mercury or the like of 1000 mJ for example, and fluorine component is removed from the surface of the recess 101 (FIG. 14(d)). Then, the resist PR2 is removed to complete the processing (FIG. 14(e)).

Note that the lyophilic processing to be performed on the recess 101 is not limited to the above. Alternatively, the lyophilic processing may be performed, by additionally performing exposure processing with use of the photomask PM4 having a halftone window after the step shown in FIG. 13(e).
(Step of Forming Organic Light-Emitting Layer in Application Step)

Figure 15:
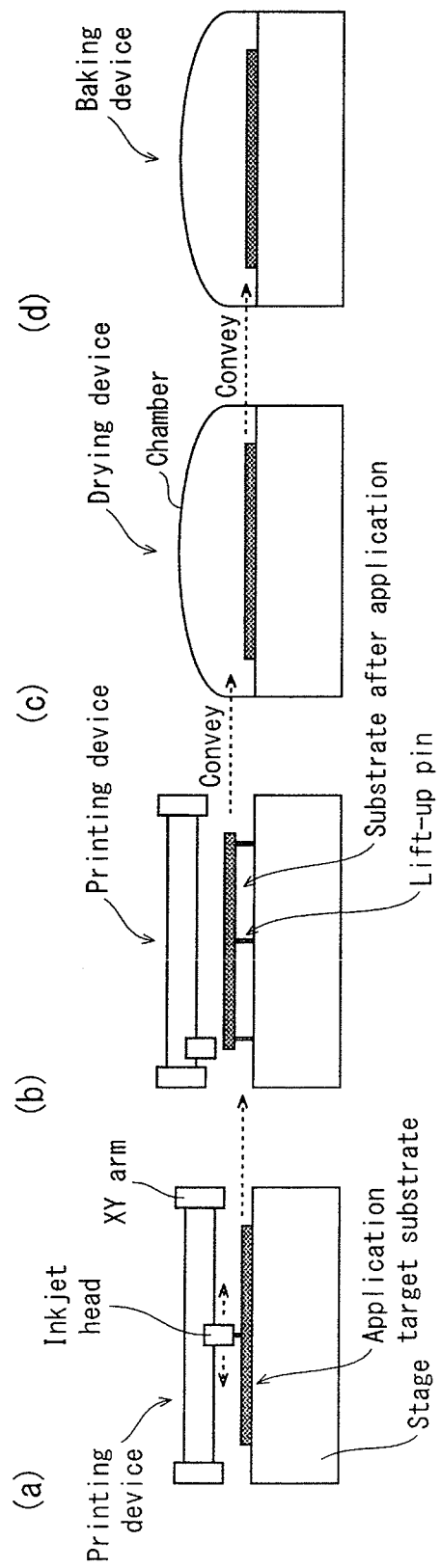
FIG. 15 schematically shows a manufacturing process of an organic EL display panel (application step).

Next, an ink containing an organic light-emitting material is applied with use of an inkjet device system (printing device). FIG. 15 schematically shows an application step (step of forming organic light-emitting layer). In FIG. 15, the step proceeds from the left to the right.

Firstly, an ink is regulated by mixing an organic material that is an organic light-emitting material with a solvent at a predetermined ratio. This ink is supplied to an inkjet head of the inkjet device shown in FIG. 15. An application target substrate is placed on a stage of the inkjet device. The inkjet head placed on an XY arm is scanned based on a wet process by a known inkjet method. Then, the ink is applied above the charge injection transport layer 7 on the element formation regions (FIG. 15(a)). This application step is performed on all the element formation regions above the application target substrate in the same manner by refilling three types of inks each having a different light-emitting color.

After completion of application of the inks of all the light-emitting colors, a lift-up pin is operated to unload the application target substrate from the stage of the inkjet device (FIG. 15(b)).

Next, the application target substrate is horizontally conveyed inside a drying device by a robot arm or a roller, and then the application target substrate is placed on a hot plate. The inside of the chamber is set to nitrogen atmosphere or vacuum atmosphere (reduced-pressure atmosphere) to dry the ink (FIG. 15(c)). Then, the application target substrate is horizontally conveyed to a baking device by the robot arm or the roller. Baking processing is performed on the application target substrate in the nitrogen atmosphere or vacuum atmosphere (reduced-pressure atmosphere). This completes an organic light-emitting layer 8.

Here, there is a possibility that while the application target substrate to which the ink has been applied is conveyed from the stage of the printing device to the drying device, the applied ink overflows beyond a predetermined element formation region due to vibration or acceleration resulting from conveying the application target substrate. In order to solve this problem, according to Embodiment 1, a recess 101 having a sufficient depth (volume) is formed on the top of the bank 10L as shown in FIG. 22. Accordingly, even if an ink 8X overflows in the row direction (Y direction), the overflowed ink 8X remains inside the recess 101 as an ink collection 9X, and is appropriately held. Therefore, it is possible to prevent color mixture of inks between element formation regions each on which an ink of a different light-emitting color is applied, thereby excellently forming an organic light-emitting layer.

Also, the surface of the main part 103 is relatively lyophobic compared with the recess 101. This prevents broad adherence of the ink to the surface of the main part 103. Therefore, the ink is appropriately held between each two adjacent banks 10L. This leads to expectation of an effect of preventing overflow of the ink beyond each element formation region.
(Step of Forming Second Electrode)

A film is formed on the surface of the organic light-emitting layer 8 using a material such as ITO and IZO by a vacuum deposition method. This completes a second electrode.
(Other Steps)

A film is formed on a surface of the second electrode using a material such as SiN and SiON by the vacuum deposition method. This results in a passivation layer.

After all of the above steps, all the organic EL elements 15R to 15B are formed. This completes an organic EL display panel 100.

Next, another embodiments of the present invention are described focusing on main characteristics of each of the embodiments.

Embodiment 2

FIG. 5 is a partial cross-sectional view showing a panel 100A relating to Embodiment 2, and corresponds to FIG. 3 showing the panel 100. The panel 100A has characteristics that a charge injection transport layer 7 is formed by an organic material such as PEDOT (polyethylenedioxythiophene) as an applying-type charge injection transport layer. In other words, in the step of forming functional layer, the charge injection transport layer 7 of the panel 100A is formed by applying an ink to the surface of the first electrode 6 between each two adjacent banks 10L and drying the applied ink. With this structure, the buried part 102 of the bank 10L is provided so as to directly contact each of the side surfaces of each of the adjacent first electrodes 6 and the inner surface of the opening 41 of the planarizing film 4.

According to the panel 100A having the above structure, it is possible to prevent color mixture of inks, thereby excellently forming an organic light-emitting layer, in substantially the same manner as the panel 100. Furthermore, it is possible to suppress uplift and detachment of the first electrode 6 by forcing the bottom part of the main part 103, which is formed integrally with the buried part 102, toward the substrate 1. Also, This leads to expectation of an effect of preventing shortage between each two adjacent first electrodes 6 in the row direction (Y direction) owing to formation of the buried part 102.

Embodiment 3

Figure 6A:
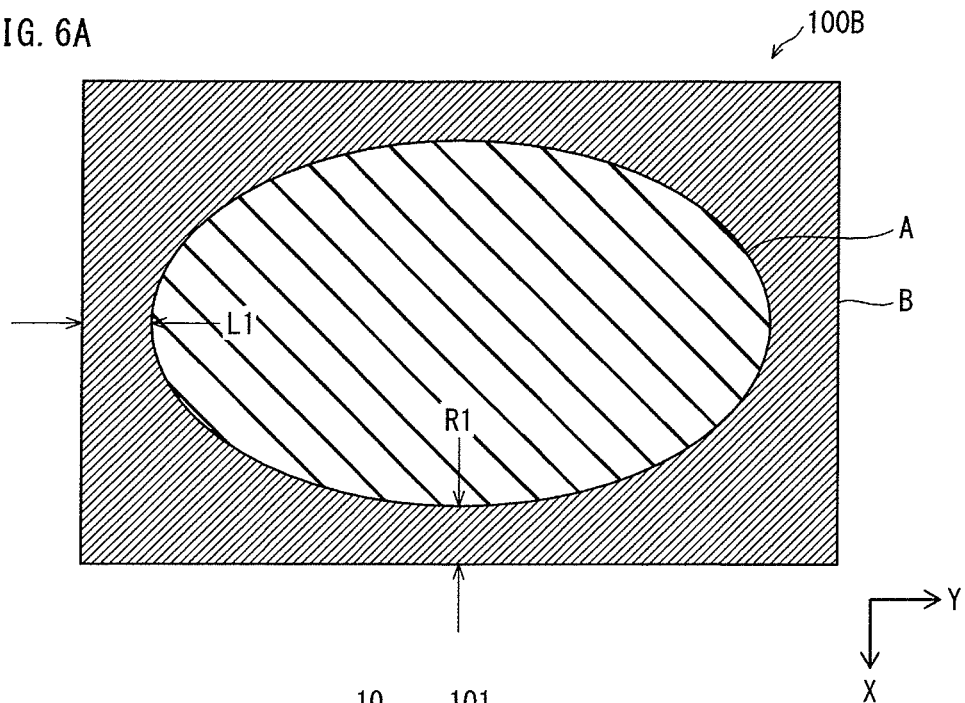
FIG. 6A is a top view schematically showing the structure of an organic EL display panel having the line bank structure relating to Embodiment 3.

FIG. 6A is a top view schematically showing the structure of a panel 100B relating to Embodiment 3. In FIG. 6A, the recess degree of the bank 10L is adjusted such that a peripheral region of the panel 100B indicated by the sign "B" is higher in recess degree of the bank 10L than a central region of the panel 100B indicated by the sign "A".

In the case where an ink is applied to an application target substrate, there is a problem of lateral distribution that color mixture of inks is likely to occur more often in the peripheral region B than the central region A. This is because of the following reason for example. When the application target substrate is moved or conveyed after the ink is applied to the panel, the angle relative to the horizontal direction is comparatively likely to vary in the peripheral region B. As a result, overflow of the ink in the peripheral region B is likely to be induced.

Figure 6B:
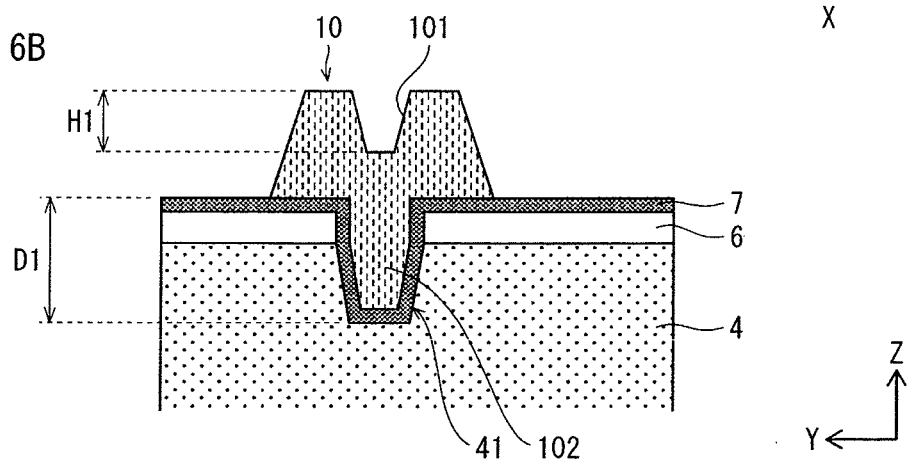
FIG. 6B and FIG. 6C are each a partial cross-sectional view of the structure of the periphery of a bank.
Figure 6C:
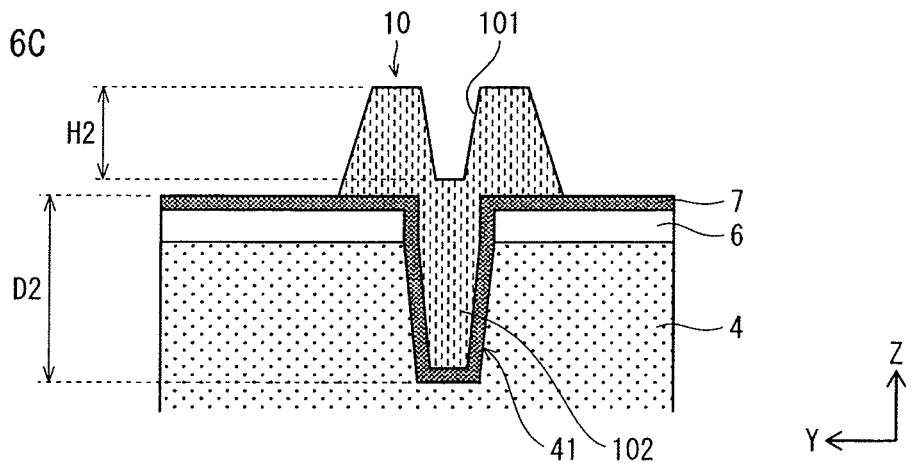

The panel 100B is formed in consideration of this problem. As shown in FIG. 6B, in the central region A, the buried part 102 is adjusted to have a depth D1 and the recess 101 is adjusted to have a depth (recess degree) H1. Compared with this, as shown in FIG. 6C, in the peripheral region B, the buried part 102 is adjusted to have a depth D2 higher than the depth D1 and a recess 101 is formed so as to have a sufficient depth H2. As an example of setting numerical values, in the case where the depth D1 is adjusted to 1000 nm, the depth H1 is adjusted to approximately 250 nm. Also, in the case where the depth D2 is adjusted to 3000 nm, the depth H2 is adjusted to approximately 750 nm. The adjustment of the depths H1, H2, D1, and D2 is performed in the above step of forming planarizing film, for example. Specifically, the adjustment is performed by performing exposure processing with use of a predetermined halftone mask (photomask PM1) in which light transmissivity is adjusted such that an exposure amount on the planarizing film material 4X differs between the central region A and the peripheral region B.

Note that as shown in FIG. 6B and FIG. 6C, the depths D1 and D2 of the buried part 102 are each actually equivalent to the total of the depth of the opening 41 of the planarizing film 4, the depth of the first electrode 6, and the depth of the charge injection transport layer 7. However, since the planarizing film 4 is in general sufficiently thicker than the first electrode 6 and the charge injection transport layer 7, and accordingly the conditions on film thickness of the planarizing film 4 is considered to be important in adjustment of the depth of the buried part 102.

Note that the pattern of the central region A provided in the panel 100B is not limited to an elliptical pattern shown in the front view in FIG. 6A. Alternatively, other pattern may be employed such as a rectangle pattern. Also, the minimum widths L1 and R1 of the peripheral region B may be each modified. For example, the minimum width L1 may be appropriately set to fall within a range of 10% to 20% of the length of the panel 100B in the row direction (Y direction). Also, the minimum width R1 may be appropriately set to fall within a range of 10% to 20% of the length of the panel 100B in the column direction (X direction).

With the above creativity, the panel 100B exhibits the same effects as those in Embodiment 1. Furthermore, even in the peripheral region B, in which color mixture of inks is conventionally likely to occur, it is possible to appropriately hold an ink overflowed beyond each element formation region in the recess 101 having a sufficient depth H2. This prevents the color mixture of inks having different light-emitting colors more effectively.

Embodiment 4

FIG. 7 is a partial enlarged view showing the periphery of elements of a panel 100C relating to Embodiment 4, and corresponds to FIG. 2 showing the panel 100.

As shown in FIG. 7, in the bank 10L of the panel 100C, elongated recesses 101 are intermittently provided so as to correspond one-to-one in position to element formation regions. The recesses 101 are provided so as to one-to-one correspond in position to luminescent regions of organic EL elements 15R, 15G, and 15B, that is, regions in which no pixel defining layer is provided. With the above creativity, in the step of forming organic light-emitting layer, it is possible to prevent color mixture of inks due to the overflow of an ink in at least a position corresponding to a luminescent region after application of the ink. Accordingly, the panel 100C exhibits substantially the same effects as those in Embodiment 1. That is, it is possible to prevent color mixture of inks having different light-emitting colors mainly in luminescent regions, thereby realizing the panel 100C having an excellent image display capability. Note that the recesses 101 may be small dots that are intermittently provided in the column direction (X direction).

Embodiment 5

FIG. 8 is a partial enlarged view showing a panel 100D relating to Embodiment 5, and corresponds to FIG. 2 showing the panel 100.

The panel 100D has so-called the pixel bank structure in which bank parts 110X and 110Y are arranged in rows and columns, respectively, so as to surround an element formation region in a corresponding position. As a result, banks 10P having a lattice shape are formed. The bank part 110X has substantially the same structure as the bank 10L of Embodiment 1. The bank 110X part has a main part formed on a buried part which is not illustrated. On the top of the main part, a recess 101X formed by recessing a bank material toward the buried part in the column direction (X direction).

The panel 100D having the above structure also exhibits the same effects as those in Embodiment 1. Color mixture of inks having different light-emitting colors is prevented, thereby excellently forming the organic light-emitting layer 8. This realizes the panel 100D having an excellent image display capability.

Embodiment 6

FIG. 9 is a partial enlarged view showing a panel 100E relating to Embodiment 6, and corresponds to FIG. 2 showing the panel 100. The panel 100E has basically the same structure as that of the panel 100D relating to Embodiment 5. Furthermore, on the top of a bank 110Y, a recess 101Y is formed in the row direction (Y direction).

The panel 100E having the above structure also exhibits the same effects as those exhibited by the panel 100D. Furthermore, it is possible to hold an overflowed ink within the recess 101Y formed in the bank 110Y, thereby preventing unnecessary overflow of an ink in the column direction (X direction) to uniformly form an thick organic light-emitting layer 8. The recess 101Y of the panel 100E is formed by forming an opening in the planarizing film 4 and recessing a bank material into the opening and the interval between each two adjacent first electrodes 6 in the row direction (Y direction).

Embodiment 7

Figure 10:
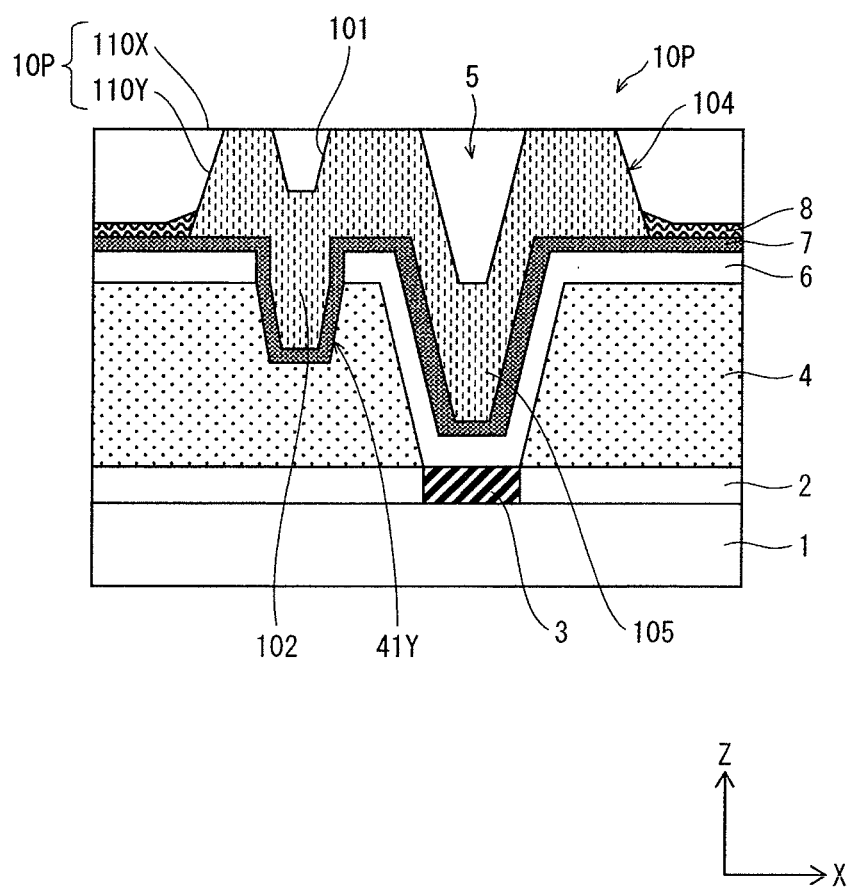
FIG. 10 is a partial cross-sectional view showing the structure of the periphery of a contact hole of an organic EL display panel having the pixel bank structure relating to Embodiment 7.
Figure 11:
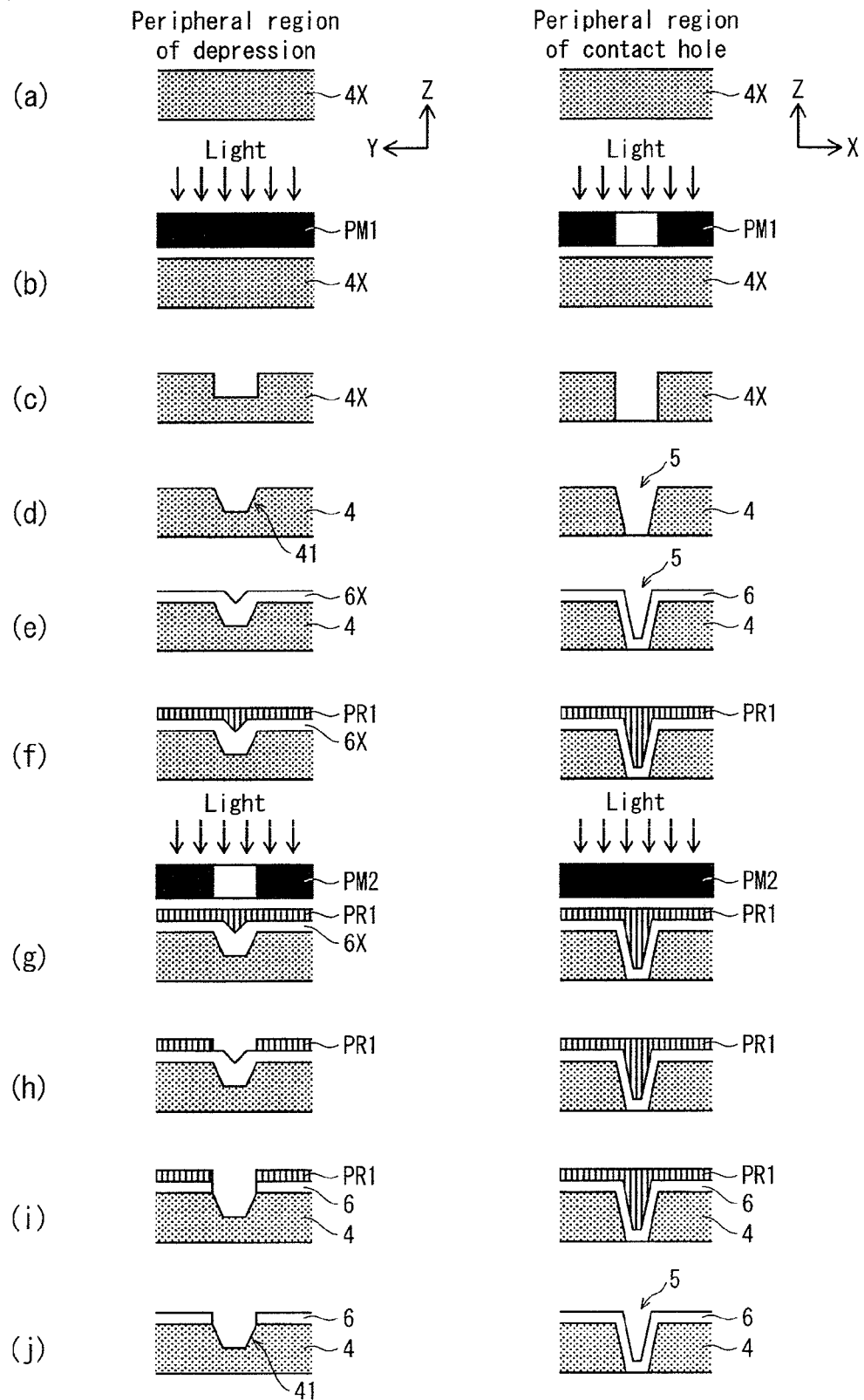
FIG. 11 shows a manufacturing process of an organic EL display panel (first method).
Figure 12:
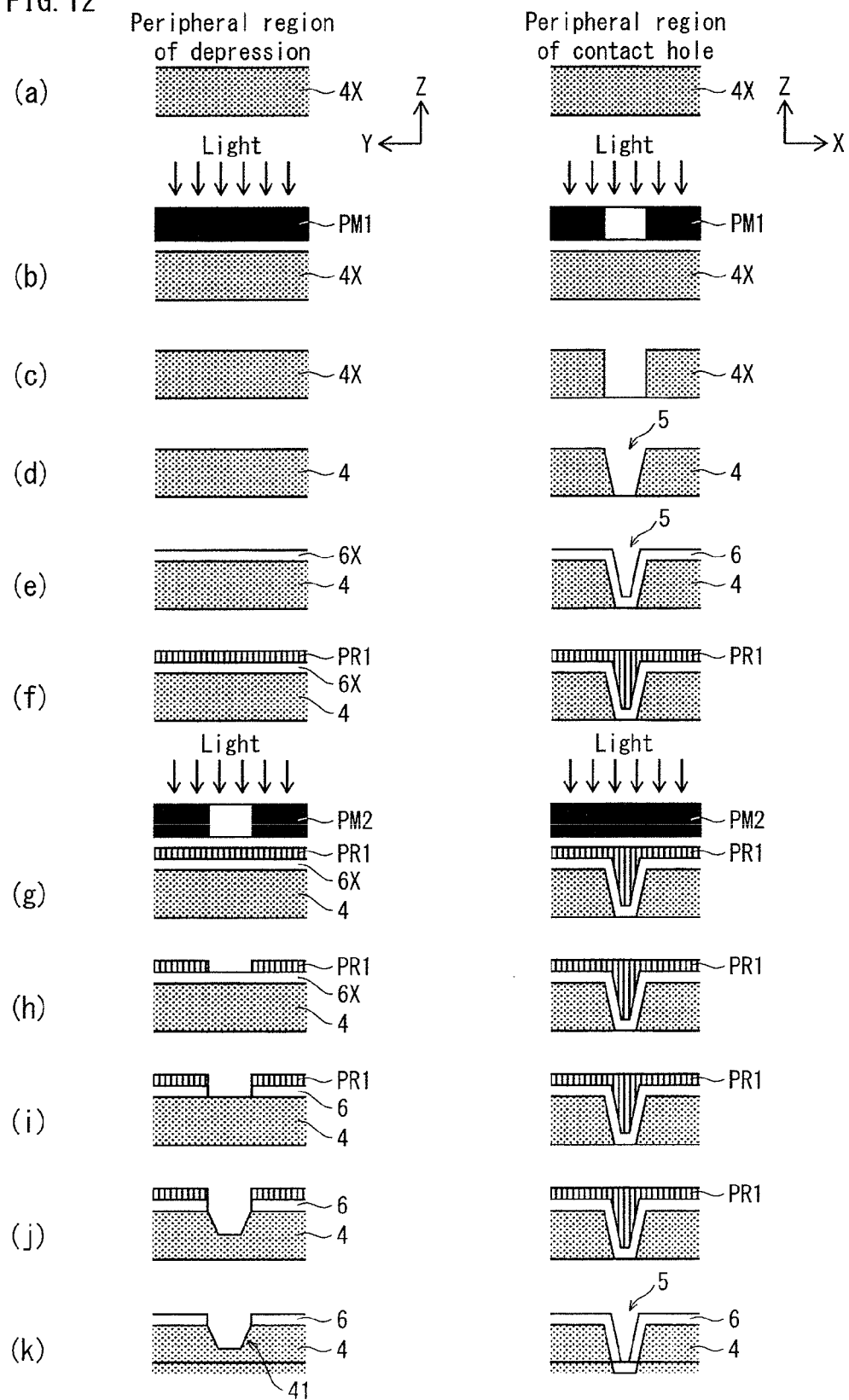
FIG. 12 shows a manufacturing process of an organic EL display panel (second method).
Figure 13:
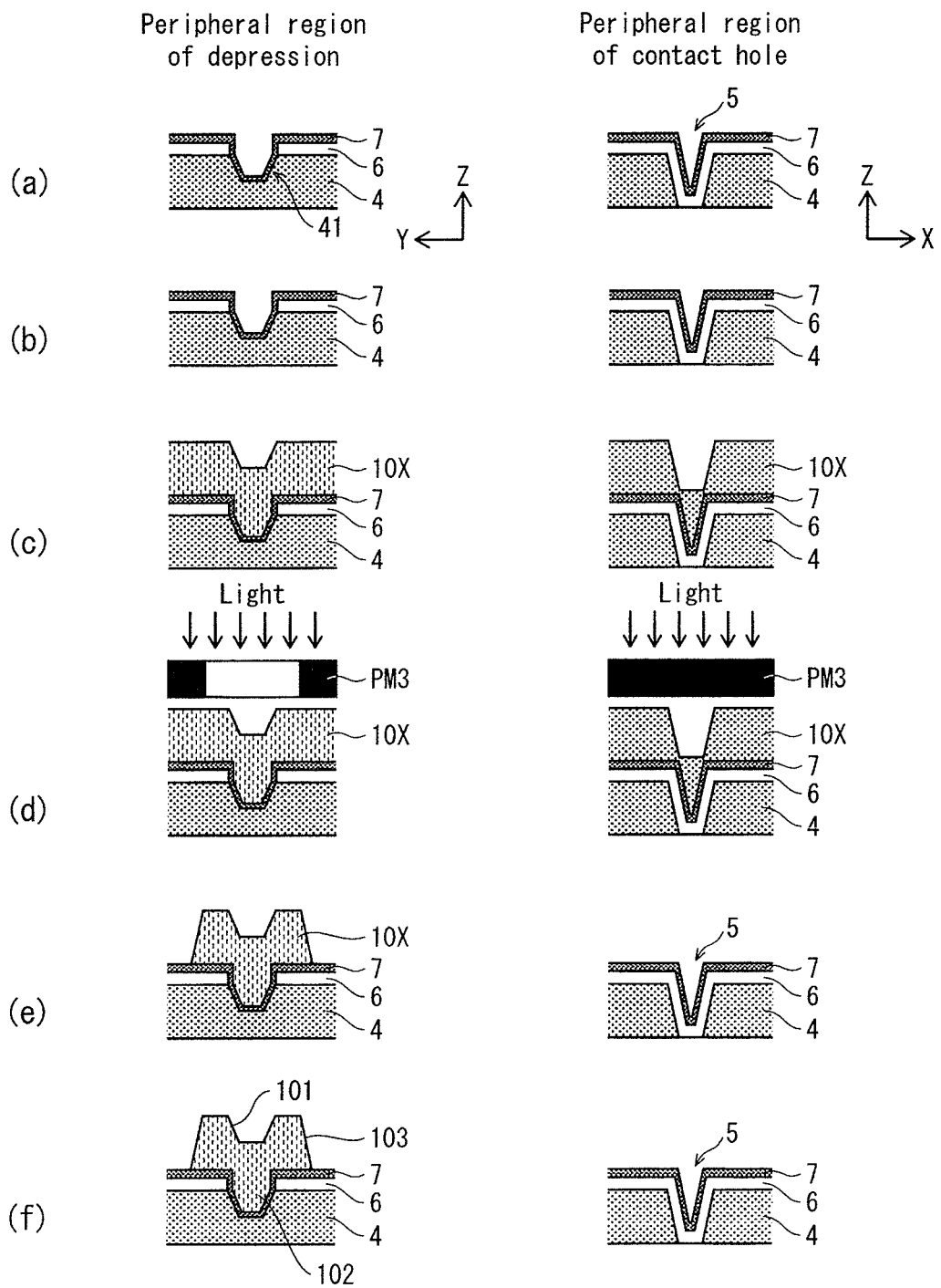
FIG. 13 shows a manufacturing process of an organic EL display panel (bank manufacturing step).
Figure 14:
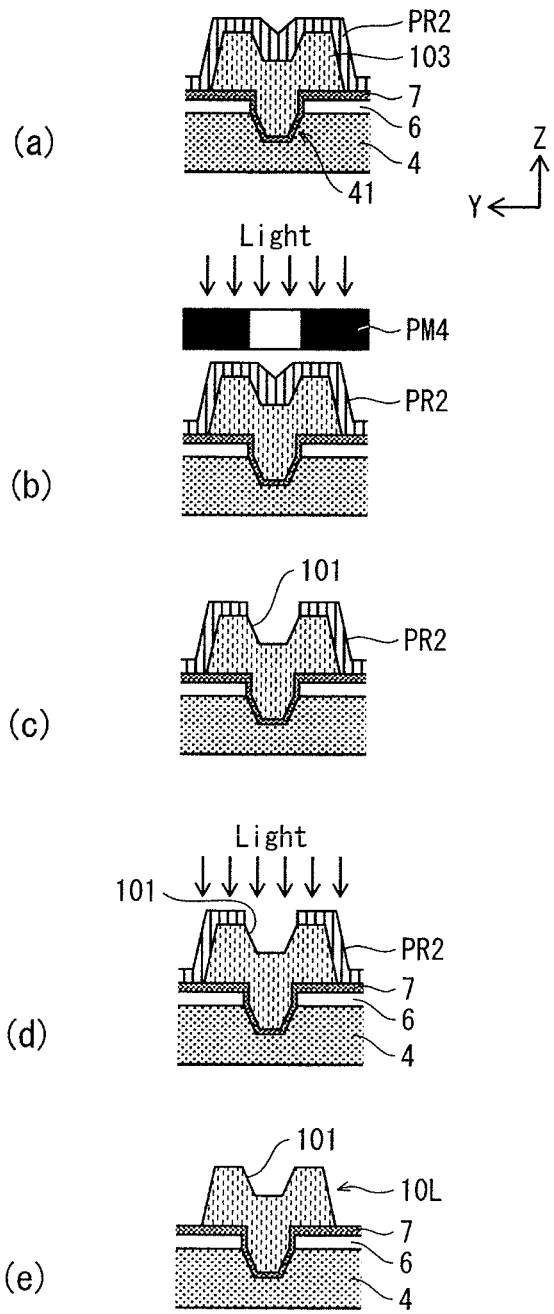
FIG. 14 shows a manufacturing process of an organic el display panel (lyophilic processing on recess).

FIG. 10 is a partial cross-sectional view showing the periphery of a contact hole of a panel 100F relating to Embodiment 7, and corresponds to FIG. 3 showing the panel 100.

The panel 100F has substantially the same structure of the panel 100E. The panel 100F has characteristics mainly in that a main part 104 of a bank 110Y extending in the row direction (Y direction) increases in width in the column direction (X direction) so as to overlap a contact hole 5. The panel 100F having this structure exhibits the same effects as those exhibited by the panel 100E. Furthermore, owing to the bank 110Y having a wide width, it is possible to effectively suppress overflow of an ink applied to each element formation region into other element formation region adjacent in the column direction (X direction). This is advantageous for forming an organic light-emitting layer 8 having a uniform thickness. Furthermore, patterning is performed on the bank 110Y together with the periphery of the contact hole 5. This leads to an advantage of patterning on the bank with relative ease in the step of forming bank, thereby efficiently manufacturing the panel 100F.

<Depth of Recess>

The following describes the relation between the depth (recess depth) of an opening formed in a planarizing film and the depth of a recess of a bank formed by the opening.

Figure 16:
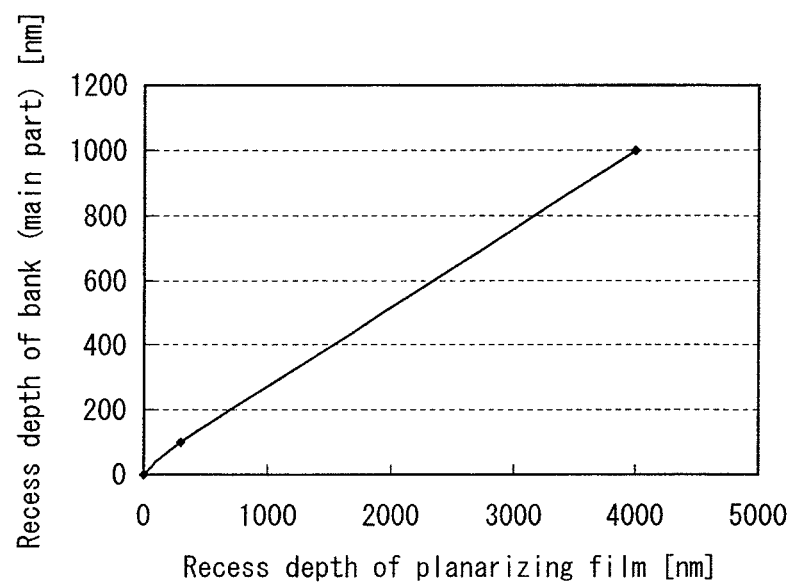
FIG. 16 is a graph showing the relation in recess depth between a bank and a planarizing film.
Figure 17:
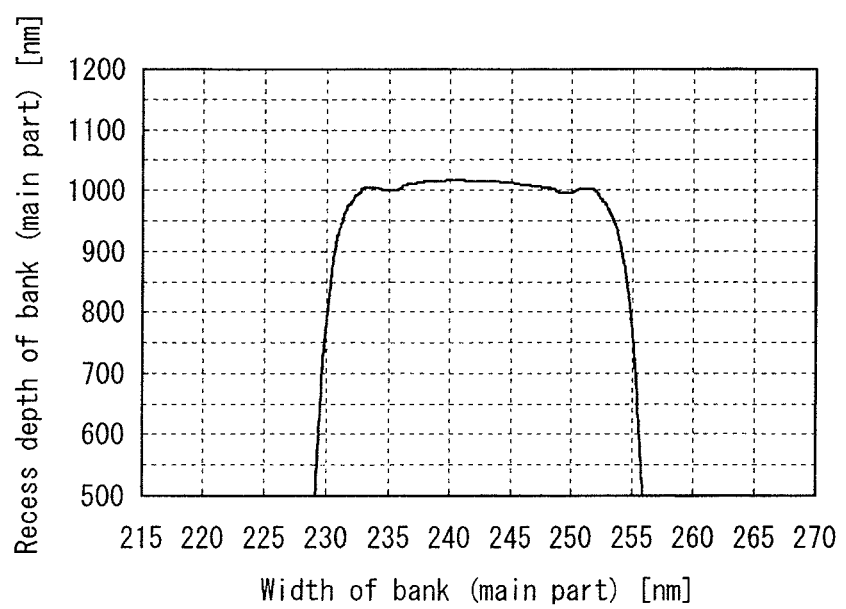
FIG. 17 shows results of measurement on the cross-section of the bank when the planarizing film has a recess of 0 nm in depth.
Figure 18:
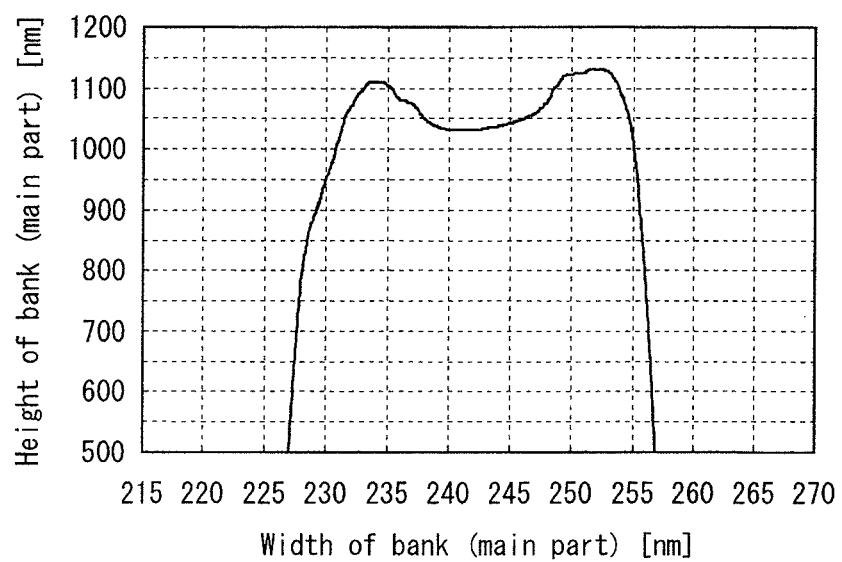
FIG. 18 shows results of measurement on the cross-section of the bank when the planarizing film has a recess of 240 nm in depth.
Figure 19:
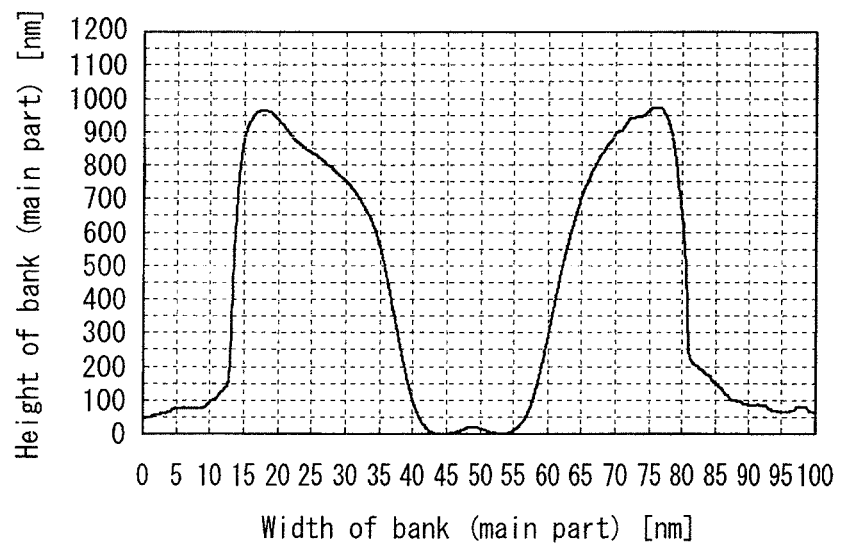
FIG. 19 shows results of measurement on the cross-section of the bank when the planarizing film has a recess of 4000 nm in depth.

FIG. 16 is a graph showing the relation between the depth (recess depth) of the opening formed in the planarizing film and the depth of the recess of the bank. FIG. 17 to FIG. 19 show results of measurement on the cross-section of the bank during variation of a recess of the opening of the planarizing film. The recess depth of the opening is adjusted by varying the exposure value with use of a known halftone mask after uniform formation of the planarizing film.

As shown in FIG. 16, the depth of the recess of the main part is substantially linearly proportional to the recess depth of the opening formed in the planarizing film. In the case where the depth of the opening is equal to or smaller than the thickness of the planarizing film, it is possible to adjust the depth of the recess in proportion to the depth of the opening. It is necessary to pay attention that the recess depth of the opening is not completely proportional to the depth of the recess of the main part (slope of the line shown in FIG. 16). It is considered that there occurs variation in the relation between the recess depth of the opening and the recess of the main part depending on the type of resist material of a bank and the properties such as viscosity and hardness of the resist material.

The following explains results of data measurement shown in FIG. 16, as an example. In this measurement experiment, the opening and the recess were set to have the depth D and the depth H, respectively, as shown in FIG. 6B and FIG. 6C. In the case where the depth D of the opening is 0 nm, the main part has no recess (FIG. 17). Compared with this, in the case where the depth of the opening was set to 240 nm, a recess having a depth H of approximately 100 nm was formed in the main part (FIG. 17). Furthermore, in the case where the depth D of the opening was set to have substantially the same thickness as that of the planarizing film, namely, 4000 nm, the depth H of the recess is substantially equal to the height of the main part, namely, 1000 nm. According to the above results, it is possible to precisely set the depth of the recess in accordance with a target value, by checking beforehand the depth of the recess of the main part varying depending on the depth D of the opening formed in the planarizing film. FIG. 19 shows results of measurement on the cross-section of the bank with use of the peripheral structure of the contact hole instead of the opening. It is considered that the same effects are exhibited.

The results of the experiment performed by the present inventors revealed that variation of the depth D of the opening within the range of 100 nm to 4000 nm enables adjustment of the depth H of the recess within the range of 25 nm to 1000 nm.

<Others>

The organic light-emitting layer 8 is exemplified as an applying-type one formed by applying an ink and drying the applied ink. Alternatively, the organic light-emitting layer 8 may be formed by other method. For example, so-called a vacuum process may be employed with use of the vacuum deposition method, the sputtering method, an electron beam method, or the like. In this case, the effects of preventing color mixture of inks cannot be exhibited. Instead, since the bank 10L is composed of the buried part 102 buried in the opening 41 and the main part 103, it is possible to exhibit effects of forcing the first electrode 6, the charge injection transport layer 7, and so on toward the substrate 1 under the main part 103, thereby appropriately preventing detachment and uplift of the first electrode 6, the charge injection transport layer 7, and so on. Furthermore, it is possible to exhibit an effect of certainly preventing shortage between each two adjacent first electrodes 6 owing to the buried part 103.

Note that the "row" direction and the "column" direction relating to the present invention are just exemplary directions that two perpendicular directions along the surface of an organic EL display panel. Accordingly, the "row" direction and the "column" direction used in the Description have no rigorous meaning, and these directions may be replaced with each other.

INDUSTRIAL APPLICABILITY

The present invention is utilizable as display elements for displays of mobiles phones, TVs, and the like, organic EL elements for various types of light sources, an organic EL display panel with use of the organic EL elements, and a method of manufacturing the organic EL display panel. It is possible to expect that, in either of the above applications, the organic EL elements and the organic EL display panel exhibit excellent luminescence properties or image display capability with less uneven display.

REFERENCE SIGNS LIST

PR1 and PR2 photoresist
PM1 to PM4 photomask
1 substrate
2 TFT wiring part (thin film transistor layer)
3 feed electrode
4 planarizing film (interlayer insulating layer)
4X planarizing film material
5 contact hole
9 first electrode (anode)
6X metal film
7 charge injection transport layer (HIL)
8 organic light-emitting layer
9 second electrode (cathode)
10L bank (line bank)
10P bank (pixel bank)
10X resist material
11 pixel defining layer (PCL)
15, 15R, 15G, and 15B organic EL element (sub-pixel)
100 and 100A to 100F organic EL display panel
101, 101X, and 101Y recess
102 and 105 buried part
103 and 104 main part
110X and 110Y bank part
200 display device

The invention claimed is:

1. An organic EL display panel, comprising:
a substrate;
an interlayer insulating layer that is provided on the substrate;
first electrodes that are provided on the interlayer insulating layer so as to correspond one-to-one to element formation regions arranged in rows and columns above the substrate;
banks that are provided extending in columns to partition the element formation regions arranged in rows;
organic light-emitting layers that are provided above the first electrodes in one-to-one correspondence, and each contain an organic light-emitting material having a light-emitting color differing between each two adjacent element formation regions arranged in rows; and
second electrodes that are provided above the organic light-emitting layers in one-to-one correspondence, and are opposite in polarity to the first electrodes,
wherein the interlayer insulating layer has a first opening that corresponds in position to an interval between each two adjacent first electrodes in rows,
the banks each have a buried part and a main part that are integrally formed, the buried part fills the interval and the first opening, and the main part is a protrusion of the buried part,
the main part has, on a top surface directly opposite the buried part, a first recess having a corresponding shape to the first opening.

2. The organic EL display panel of claim 1,
wherein the organic light-emitting layers each result from applying ink containing the organic light-emitting material to one of the element formation regions, and drying the applied ink.

3. The organic EL display panel of claim 1,
wherein the banks are arranged in parallel rows at predetermined intervals.

4. The organic EL display panel of claim 3,
wherein the first recesses are formed in columns.

5. The organic EL display panel of claim 1, further comprising:
banks that are provided extending in rows to partition the element formation regions arranged in columns.

6. The organic EL display panel of claim 5,
wherein the interlayer insulating layer has further provided therein a second opening that corresponds in position to an interval between each two adjacent first electrodes in columns,
the banks extending in rows each have a buried part and a main part that are integrally formed, the buried part fills the interval in columns and the second opening, and the main part is a protrusion of the buried part, and
the main part has, on a top thereof, a second recess along with the respective shapes of the interval in columns and the second opening.

7. The organic EL display panel of claim 1,
wherein the first recess has higher lyophilicity than a surface of the main part.

8. The organic EL display panel of claim 6,
wherein the second recess has higher lyophilicity than a surface of the main part.

9. The organic EL display panel of claim 1, further comprising:
one or more functional layers that are provided between the first electrodes and the organic light-emitting layers,
wherein the functional layers each include a charge injection transport layer for injecting or transporting charge, and
the charge injection transport layer directly contacts the first electrodes and covers the interval between each two adjacent first electrodes in rows and an inner periphery of each of the first openings.

10. The organic EL display panel of claim 1, further comprising
one or more functional layers that are provided between the first electrodes and the organic light-emitting layers,
wherein the functional layers each include a charge injection transport layer for injecting or transporting charge, and
the banks each contact the interval between each two adjacent first electrodes in rows and an inner periphery of each of the first openings.

11. The organic EL display panel of claim 1,
wherein the first recess has a depth equivalent to 10% to 100% of a length from an upper surface of the interlayer insulating layer to the top of the main part.

12. The organic EL display panel of claim 1,
wherein the first recess of the main part is located directly above the first opening of the interlayer insulating layer.

13. The organic EL display panel of claim 1,
wherein first openings are formed over the element formation regions.

* * * * *